(12) United States Patent
Umeda et al.

(10) Patent No.: US 8,535,108 B2
(45) Date of Patent: Sep. 17, 2013

(54) FORMATION METHOD OF AN ORGANIC LAYER, MANUFACTURING METHOD OF AN ORGANIC ELECTROLUMINESCENT ELEMENT, ORGANIC ELECTROLUMINESCENT ELEMENT, AND ORGANIC ELECTROLUMINESCENT DISPLAY DEVICE

(75) Inventors: Tokiyoshi Umeda, Osaka (JP); Tohru Sonoda, Osaka (JP); Hideki Uchida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 13/378,032

(22) PCT Filed: Jun. 1, 2010

(86) PCT No.: PCT/JP2010/003666
§ 371 (c)(1),
(2), (4) Date: Dec. 31, 2011

(87) PCT Pub. No.: WO2011/001596
PCT Pub. Date: Jan. 6, 2011

(65) Prior Publication Data
US 2012/0086330 A1    Apr. 12, 2012

(30) Foreign Application Priority Data
Jul. 3, 2009   (JP) .................................. 2009-158866

(51) Int. Cl.
*H01L 51/56* (2006.01)
(52) U.S. Cl.
USPC ............... 445/24; 427/66; 156/239; 156/230; 156/235; 156/237

(58) Field of Classification Search
USPC ..... 313/500–512; 445/24, 25; 156/230–241; 427/66
See application file for complete search history.

(56) References Cited

U.S. PATENT DOCUMENTS

| | | | |
|---|---|---|---|
| 2005/0140291 A1* | 6/2005 | Hirakata et al. | 313/512 |
| 2008/0012476 A1* | 1/2008 | Kim et al. | 313/504 |

(Continued)

FOREIGN PATENT DOCUMENTS

| | | |
|---|---|---|
| JP | 8-227276 A | 9/1996 |
| JP | 9-167684 A | 6/1997 |

(Continued)

OTHER PUBLICATIONS

International Search Report received for PCT Patent Application No. PCT/JP2010/003666, mailed on Jul. 6, 2010, 5 pages (2 pages of English Translation and 3 pages of PCT Search Report).

(Continued)

*Primary Examiner* — Mariceli Santiago
(74) *Attorney, Agent, or Firm* — Morrison & Foerster LLP

(57) ABSTRACT

A formation method of an organic layer (13) includes a transfer process of forming the organic layer (13) by superposing a donor substrate (30) having a light heat converting layer (32) and a transfer layer (34) formed sequentially to cover at least regions corresponding to organic layer formation regions on a support plate (31) and a transfer mask (40) having openings corresponding to the organic layer formation regions, on each other so that the transfer layer-side surface of the donor substrate (30) comes into contact with the transfer mask (40), and, with the resultant structure placed above a transfer target substrate (20) so that the transfer mask (40) is on the lower side, transferring the transfer layer (34) onto the transfer target substrate (20) via the openings of the transfer mask (40).

3 Claims, 14 Drawing Sheets

(56) References Cited

U.S. PATENT DOCUMENTS

2009/0045735 A1    2/2009   Matsunami et al.
2009/0104721 A1    4/2009   Hirakata et al.

FOREIGN PATENT DOCUMENTS

| | | | |
|---|---|---|---|
| JP | 11-54275 A | | 2/1999 |
| JP | 2000-195665 A | | 7/2000 |
| JP | 2000195665 A | * | 7/2000 |
| JP | 2005-322564 A | | 11/2005 |
| JP | 2008-171993 A | | 7/2008 |
| JP | 2009-32528 A | | 2/2009 |
| JP | 2009-48811 A | | 3/2009 |
| JP | 2009-120946 A | | 6/2009 |
| JP | 2009-129728 A | | 6/2009 |
| JP | 2009-146716 A | | 7/2009 |
| WO | 2009/057689 A1 | | 5/2009 |

OTHER PUBLICATIONS

Written Opinion received for PCT Patent Application No. PCT/JP2010/003666, mailed on Jul. 6, 2010, 11 pages (5 pages of English Translation and 6 pages of Written Opinion).

\* cited by examiner (a)    (b)

FIG.14
(a) 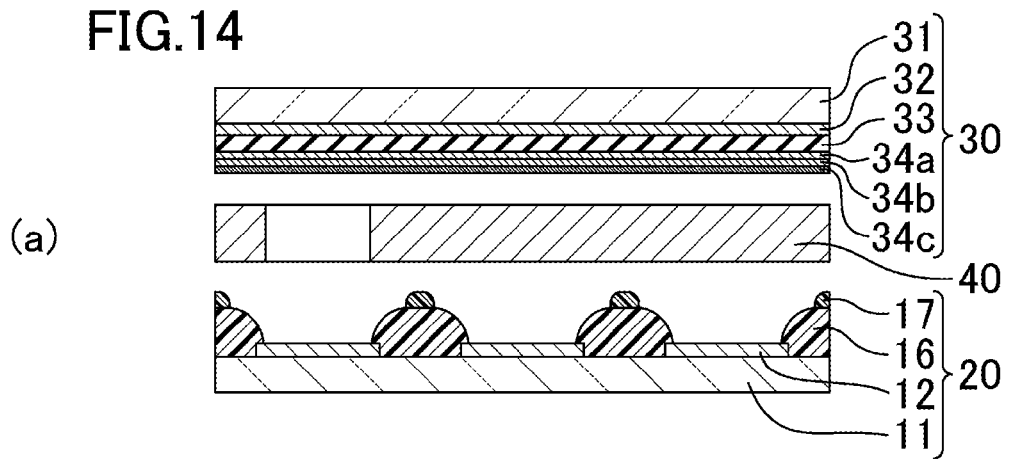
(b) 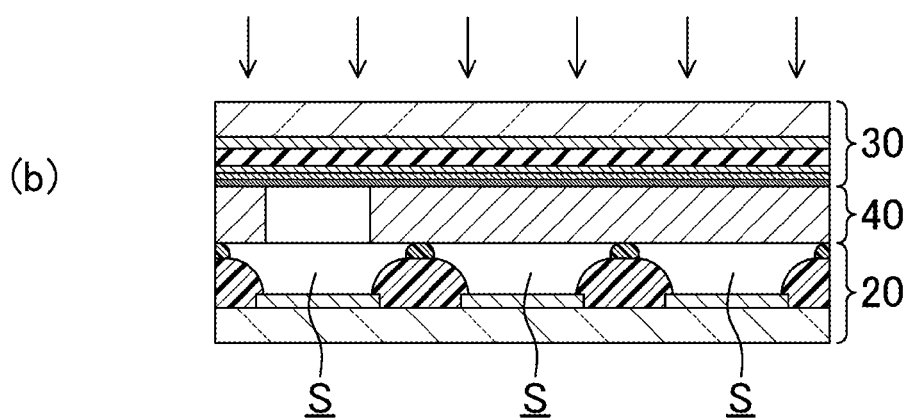
(c) 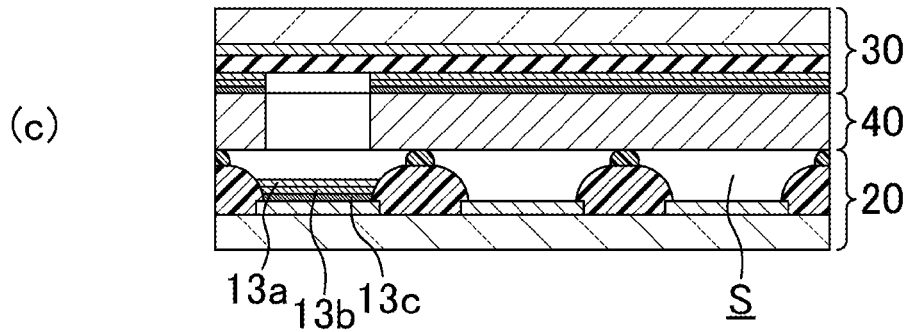
(d) 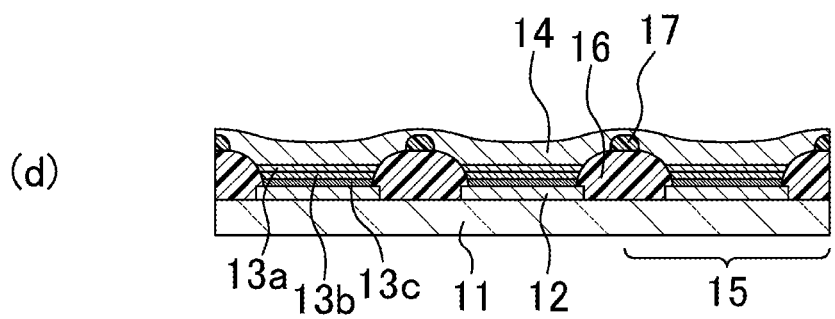

FORMATION METHOD OF AN ORGANIC LAYER, MANUFACTURING METHOD OF AN ORGANIC ELECTROLUMINESCENT ELEMENT, ORGANIC ELECTROLUMINESCENT ELEMENT, AND ORGANIC ELECTROLUMINESCENT DISPLAY DEVICE

CROSS REFERENCE TO RELATED APPLICATIONS

This is a U.S. National Phase patent application of PCT/JP2010/003666, filed Jun. 1, 2010, which claims priority to Japanese Patent Application No. 2009-158866, filed Jul. 3, 2009, each of which is hereby incorporated by reference in the present disclosure in its entirety.

TECHNICAL FIELD

The present disclosure relates to a formation method of an organic layer, a manufacturing method of an organic electroluminescent element (hereinafter referred to as an "organic EL element"), an organic EL element, and an organic electroluminescent display device (hereinafter referred to as an "organic EL display device").

BACKGROUND ART

In recent years, organic EL display devices having organic EL elements have been broadly used as displays of mobile phones and TV sets, etc. Organic EL elements, each having a structure of a first electrode, an organic EL layer, and a second electrode formed on top of another in this order on a substrate, have received attention as light emitting elements capable of low-voltage direct-current drive. For formation of an organic EL layer, generally known are methods of forming an organic layer by a vacuum evaporation technique using a shadow mask (e.g., Patent Document 1), by an ink jet technique, and by a transfer technique with laser irradiation. Among these techniques, use of the transfer technique is preferable when an organic layer is to be formed by high-definition patterning even for a large-size panel.

Examples of the formation method of an organic layer by the transfer technique include a laser transfer method and a method using a lamp.

In the laser transfer method, a donor substrate including a light heat converting layer and an organic layer formed on the entire substrate surface and a transfer target substrate on which an organic layer is to be formed are used. The two substrates are opposed to each other, and regions corresponding to organic layer formation regions are irradiated with laser light. The portions of the organic layer in the laser-irradiated regions sublimate and adhere to the transfer target substrate, whereby the organic layer is formed by transfer (see Patent Document 2, for example).

Patent Documents 3 and 4 disclose formation methods of an organic layer where a donor substrate is opposed to a transfer target substrate via a transfer mask, to form an organic layer by transfer. In these methods, the donor substrate and the transfer mask are placed one upon the other with a given spacing therebetween.

CITATION LIST

Patent Document

PATENT DOCUMENT 1: Japanese Patent Publication No. H08-227276

PATENT DOCUMENT 2: Japanese Patent Publication No. H09-167684

PATENT DOCUMENT 3: Japanese Patent Publication No. 2000-195665

PATENT DOCUMENT 4: Japanese Patent Publication No. H11-54275

SUMMARY OF THE INVENTION

Technical Problem

In the laser transfer method, since the organic layer formation regions are determined with the regions that are subjected to laser irradiation, the transfer positions may be displaced depending on the precision of scanning with a laser light source. Also, since the transfer is performed by scanning the donor substrate with the laser light source, the intensity of laser irradiation may vary with positions on the substrate.

In the methods described in Patent Documents 3 and 4, it is difficult to hold the donor substrate and the transfer mask placed on top of the other in the non-contact state with a given distance therebetween and yet maintain high precision, causing a possibility that the transfer positions may be displaced. In particular, with increase in the size of the substrate, the transfer mask and the transfer target substrate tend to bend, making it more difficult to keep uniform the distance between the donor substrate and the transfer mask over the entire substrate surface. Also, if a rigid frame is used to support the transfer mask to attain higher definition in a large-size substrate, the device may become enormous and complicate, causing a possibility of reducing the safety in the manufacturing process. Moreover, since the donor substrate and the transfer mask are not in contact with each other, the transfer material will diffuse into the space between the donor substrate and the transfer mask during sublimation, causing spread of the transfer material into even outside the transfer-desired regions. This reduces the amount of the transfer material passing through openings of the transfer mask and thus degrades the material use efficiency.

It is an objective of the present disclosure to form an organic layer by transfer with excellent transfer precision. It is another objective of the present disclosure to form an organic EL layer by transfer with excellent transfer precision using the formation method of an organic layer, to provide an organic EL element, and an organic EL display device, excellent in emission property.

Solution to the Problem

The formation method of an organic layer of the present disclosure includes a transfer process of forming an organic layer by superposing a donor substrate having a light heat converting layer and a transfer layer formed sequentially to cover at least regions corresponding to organic layer formation regions on a support plate, a transfer mask having openings corresponding to the organic layer formation regions, and a transfer target substrate on a surface of which an organic layer is to be formed, on one another so that one surface of the transfer mask comes into contact with a transfer layer-side surface of the donor substrate and the other surface of the transfer mask comes into contact with the organic layer formation-side surface of the transfer target substrate, and, in this state, transferring the transfer layer onto the transfer target substrate via the openings of the transfer mask.

According to the method described above, transfer of the organic layer is performed in the state where the donor substrate, the transfer mask, and the transfer target substrate are superposed so that one surface of the transfer mask comes into contact with the transfer layer-side surface of the donor substrate and the other surface thereof comes into contact with the organic layer formation-side surface of the transfer target substrate. Therefore, it is possible to prevent or reduce bending of the transfer mask in the superposed state, and also hold the donor substrate and the transfer target substrate with a uniform distance therebetween over the entire substrate surface. Thus, excellent transfer precision can be ensured in the formation of the organic layer.

The donor substrate may have the light heat converting layer formed on the entire surface of the support plate. In this case, it is preferable that the transfer mask is lower in thermal conductivity than the light heat converting layer.

Since the transfer mask described above is lower in thermal conductivity than the light heat converting layer, temperature rise in the transfer mask can be prevented or reduced, and thus occurrence of the problem that the transfer target substrate may be heated and thus damaged can be prevented or reduced.

The donor substrate may have the light heat converting layer formed by patterning to cover the regions corresponding to the organic layer formation regions on the support plate.

Since the donor substrate described above has no light heat converting layer in regions other than the organic layer formation regions, heating of the donor substrate can be limited to only the necessary portions. Therefore, with no unnecessary heating of regions other than the organic layer formation regions, occurrence of the problem that the transfer target substrate is damaged by heat can be prevented or reduced.

In the formation method of an organic layer of the present disclosure, preferably, a transfer material constituting the transfer layer is an organic compound having a molecular weight of 2000 or less.

Preferably, a transfer material constituting the transfer layer starts vaporization at a temperature of 100-500° C. and is transferred onto the transfer target substrate.

In the formation method of an organic layer of the present disclosure, preferably, the pressure of space between the donor substrate and the transfer target substrate is made lower than the pressure in the surrounding space.

According to the method described above, a force of bringing the donor substrate and the transfer target substrate into intimate contact with each other is applied to the substrates due to the difference in pressure between the inside and outside of the space. Since this force is exerted uniformly over the entire substrate surface, the distance between the substrates can be kept uniform over the entire substrate surface.

In the formation method of an organic layer of the present disclosure, preferably, in the transfer process, the transfer layer is transferred onto the transfer target substrate by irradiating the entire surface of the donor substrate with radiation.

According to the method described above, since the entire surface of the donor substrate is irradiated with radiation, it is unnecessary to scan the surface with a radiation source, and thus the work time can be shortened. Also, it is possible to prevent or reduce occurrence of variations in the light intensity of the radiation, unlike the case of irradiation by scanning with a radiation source. Thus, the organic layer can be transferred uniformly over the entire surface of the donor substrate.

The radiation may be laser light.

Alternatively, the radiation may be flash lump light.

The transfer layer may have a layered structure of a second transfer layer made of a second transfer material and a first transfer layer made of a first transfer material formed on the second transfer layer, and a first organic layer may be formed of the first transfer material and a second organic layer may be formed of the second transfer material on the first organic layer by one time of transfer operation, to provide an organic layer with a two-layer structure.

According to the method described above, when different kinds of organic layers are transferred to obtain a layered structure of a first organic layer and a second organic layer, for example, two kinds of organic layers can be formed by one time of transfer. Moreover, by combining this operation with another, three or more kinds of organic layers can be formed on top of another.

In the case described above, preferably, the first transfer material is higher in vaporizing temperature than the second transfer material.

In the formation method of an organic layer of the present disclosure, preferably, a surface of the transfer mask facing the transfer layer of the donor substrate is higher in optical reflectance than a transfer mask-side surface of the light heat converting layer.

According to the method described above, the surface of the transfer mask facing the transfer layer of the donor substrate is higher in optical reflectance than the transfer mask-side surface of the light heat converting layer. Therefore, even if light reaches the transfer mask without being converted to heat by the light heat converting layer, the light is reflected from the high-reflectance surface of the transfer mask toward the light heat converting layer. This can enhance the light-to-heat conversion efficiency, and also prevent or reduce occurrence of the problem that the surface of the transfer target substrate is damaged due to the light reaching the transfer target substrate. In particular, when the light heat converting layer is formed by patterning, light incident on regions other than the organic layer formation regions passes through the light heat converting layer toward the transfer target substrate without being converted to heat. In this case, also, since the light is reflected by the transfer mask, the problem that the surface of the transfer target substrate is damaged by light can be widely reduced.

In the case described above, preferably, the transfer mask has a light reflection layer formed to cover a surface of a mask body facing the transfer layer of the donor substrate.

With formation of the light reflection layer on the surface of the transfer mask, the optical reflectance of the transfer mask surface can be enhanced. Therefore, an inexpensive material can be used for formation of the mask body.

In the case described above, preferably, the transfer mask has the light reflection layer made of aluminum formed on the mask body made of polyimide.

The manufacturing method of an organic EL element of the present disclosure is a method for manufacturing an organic EL element including a substrate body, a first electrode formed to cover at least a region including a light emitting region on the substrate body, an organic EL layer formed to cover at least a region including a light emitting region on the first electrode, and a second electrode formed to cover the organic EL layer, wherein a formation method of an organic layer is used to form the organic EL layer as the organic layer, regarding the substrate body with the first electrode formed on the surface thereof as the transfer target substrate.

According to the method described above, transfer of the organic EL layer is performed in the state where the donor substrate and the donor mask are superposed so that the transfer layer-side surface of the donor substrate comes into contact with the donor mask. Therefore, it is possible to prevent or reduce bending of the transfer mask in the superposed state, and also hold the donor substrate and the transfer target substrate with a uniform distance therebetween over the entire substrate surface. Thus, excellent transfer precision can be ensured in the formation of the organic EL layer.

In the manufacturing method of an organic EL element of the present disclosure, preferably, a plurality of mask spacers are formed in a region other than the light emitting region on the substrate body, and the plurality of mask spacers are in contact with the transfer mask to hold the transfer mask.

According to the method described above, since the mask spacers are provided on the substrate body, the superposed donor substrate/transfer mask structure and the transfer target substrate can be secured to each other easily.

In the manufacturing method of an organic EL element described above, preferably, an edge cover is provided to cover the periphery of the first electrode, and the mask spacers and the edge cover are formed simultaneously.

According to the method described above, the edge cover can be formed easily without the necessity of increasing the number of manufacturing steps.

The organic EL element of the present disclosure is an organic EL element including a substrate body, a first electrode formed to cover at least a region including a light emitting region on the substrate body, an organic EL layer formed to cover at least a region including a light emitting region on the first electrode, and a second electrode formed to cover the organic EL layer, wherein the organic EL element is formed using the manufacturing method of an organic EL element of the present disclosure.

According to the configuration described above, since the organic EL element includes the organic EL layer formed by the formation method of an organic layer described above, it is possible to prevent or reduce occurrence of evaporation deviation of the organic EL layer from the light emitting region. As a result, excellent emission brightness can be obtained.

In the organic EL element of the present disclosure, preferably, a plurality of mask spacers are formed in a region other than the light emitting region on the substrate body.

In the case described above, preferably, the plurality of mask spacers are arranged to surround the light emitting region as viewed from top.

According to the configuration described above, since the mask spacers are arranged to surround the light emitting region as viewed from top, the distance between the two substrates can be kept constant in the light emitting region, and thus excellent transfer precision can be ensured.

Preferably, the plurality of mask spacers are not provided to surround the light emitting region over the entire periphery.

According to the configuration described above, since the mask spacers are not provided along the entire periphery, the space between the donor substrate and the transfer target substrate is continuous, and thus the pressure can be made uniform.

The plurality of mask spacers may be formed to extend in parallel with one another in one direction on the substrate body, as viewed from top, or may be formed in a shape of columns and arranged in a matrix as a whole. Otherwise, each of the plurality of mask spacers may be placed in an L-shaped portion of the periphery of the light emitting region as viewed from top.

In the organic EL element of the present disclosure, a peripheral spacer may be provided on the substrate body to surround the light emitting region and the plurality of mask spacers as viewed from top.

For an organic EL element where the light emitting regions are sparse in the edge portions of the substrate body, for example, the mask spacers are also sparse in the edge portions. Therefore, in the edge portions, it is difficult to maintain the distance between the transfer mask and the transfer target substrate at the time of formation of the organic EL layer. According to the configuration described above, since the peripheral spacer is provided to surround the plurality of mask spacers, it is easy to keep constant the distance between the transfer mask and the transfer target substrate over the entire substrate surface. Thus, excellent transfer precision can be ensured. Also, since a constant distance between the substrates can be secured even in the edge portions of the transfer target substrate, the space between the donor substrate and the transfer target substrate can be continuous, and thus the pressure can be made uniform.

Preferably, the peripheral spacer is placed symmetrically in a horizontal and/or vertical direction as viewed from top.

According to the configuration described above, since the peripheral spacer is provided to be symmetric, it is easy to keep constant the distance between the substrates over the entire substrate surface.

Preferably, an auxiliary spacer is further provided on a portion outside the peripheral spacer on the substrate body, and the peripheral spacer and the auxiliary spacer are placed symmetrically in a horizontal and/or vertical direction as a whole as viewed from top.

According to the configuration described above, since the auxiliary spacer is provided in addition to the peripheral spacer, even when the degree of symmetry is low with only the peripheral spacer, the symmetry of the layout of the entire spacers enhances. Thus, the distance between the substrates can be kept constant over the entire substrate surface.

In the organic EL element of the present disclosure, preferably, an edge cover is provided on the substrate body to cover the periphery of the first electrode.

When an edge cover is provided on the substrate body, preferably, the thickness of a portion of the organic EL layer in a center portion of the light emitting region is equal to the thickness of a portion thereof in a peripheral portion of the light emitting region.

According to the configuration described above, since the thickness of the organic EL layer is uniform over the entire light emitting region including the center portion and the peripheral portion, occurrence of conduction between the first and second electrodes due to a thinned peripheral portion of the organic EL layer can be prevented or reduced.

When an edge cover is provided on the substrate body, preferably, the mask spacers and the edge cover are formed of the same material.

The organic EL display device of the present disclosure includes the organic EL element of the present disclosure having the organic EL layer formed by the formation method of an organic layer of the present disclosure. Therefore, excellent emission brightness can be exhibited. Also, in the organic EL element constituting the organic EL display device, the organic EL layer is formed by the formation method of an organic layer described above. Therefore, the thickness of the organic EL layer can be easily controlled with the light irradiation amount, the thickness of the transfer film, the distance between the substrates, etc. Thus, by changing the thickness of the organic EL layer formed for each light emitting region, a micro-cavity structure type organic EL display device can be easily manufactured.

Advantages of the Invention

According to the formation method of an organic layer of the present disclosure, transfer of the organic layer is performed in the state where the donor substrate, the transfer mask, and the transfer target substrate are superposed so that one surface of the transfer mask comes into contact with the transfer layer-side surface of the donor substrate and the other surface thereof comes into contact with the organic layer formation-side surface of the transfer target substrate. Therefore, it is possible to prevent or reduce bending of the transfer mask in the superposed state, and also hold the donor substrate and the transfer target substrate with a uniform distance therebetween over the entire substrate surface. Thus, excellent transfer precision can be ensured in the organic layer formation.

According to the manufacturing method of an organic EL element of the present disclosure, transfer of the organic EL layer is performed in the state where the donor substrate and the donor mask are superposed so that the transfer layer-side surface of the donor substrate comes into contact with the donor mask. Therefore, it is possible to prevent or reduce bending of the transfer mask in the superposed state, and also hold the donor substrate and the transfer target substrate with a uniform distance therebetween over the entire substrate surface. Thus, excellent transfer precision can be ensured in the formation of the organic EL layer.

According to the organic EL element of the present disclosure, since the organic EL layer is formed by the formation method of an organic layer described above, it is possible to prevent or reduce occurrence of evaporation deviation of the organic EL layer from the light emitting region, and as a result, excellent emission brightness can be obtained.

According to the organic EL display device of the present disclosure, which has the organic EL element described above, excellent emission brightness can be obtained even if the display device is a large-panel organic EL display device.

Also, in the organic EL element constituting the organic EL display device of the present disclosure, in which the organic EL layer is formed by the formation method of an organic layer described above, the thickness of the organic EL layer can be easily controlled with the light irradiation amount, the thickness of the transfer film, the distance between the substrates, etc.

BRIEF DESCRIPTION OF THE DRAWINGS

FIGS. 14A-14D are views illustrating a manufacturing method of the organic EL display device of the third embodiment

DESCRIPTION OF EMBODIMENTS

First Embodiment

Figure 1:
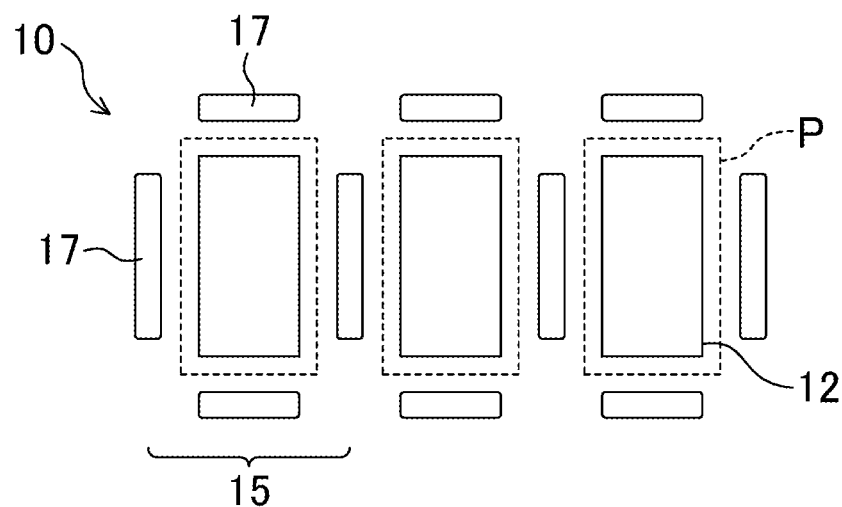
FIG. 1 is a plan view of an organic EL display device.
Figure 2:
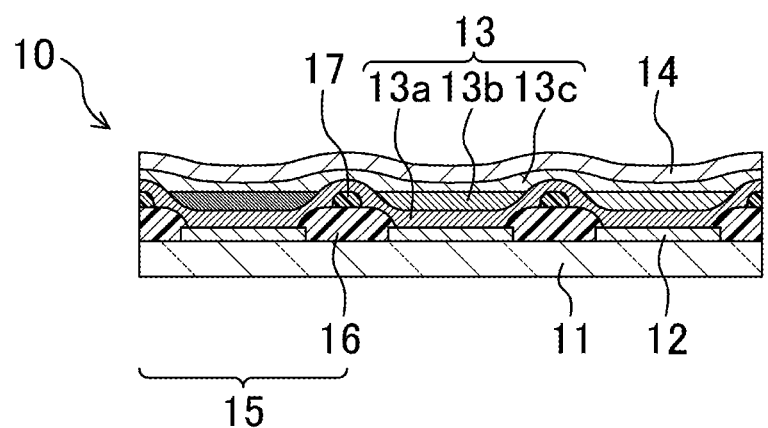
FIG. 2 is a cross-sectional view of the organic EL display device.
Figure 3:
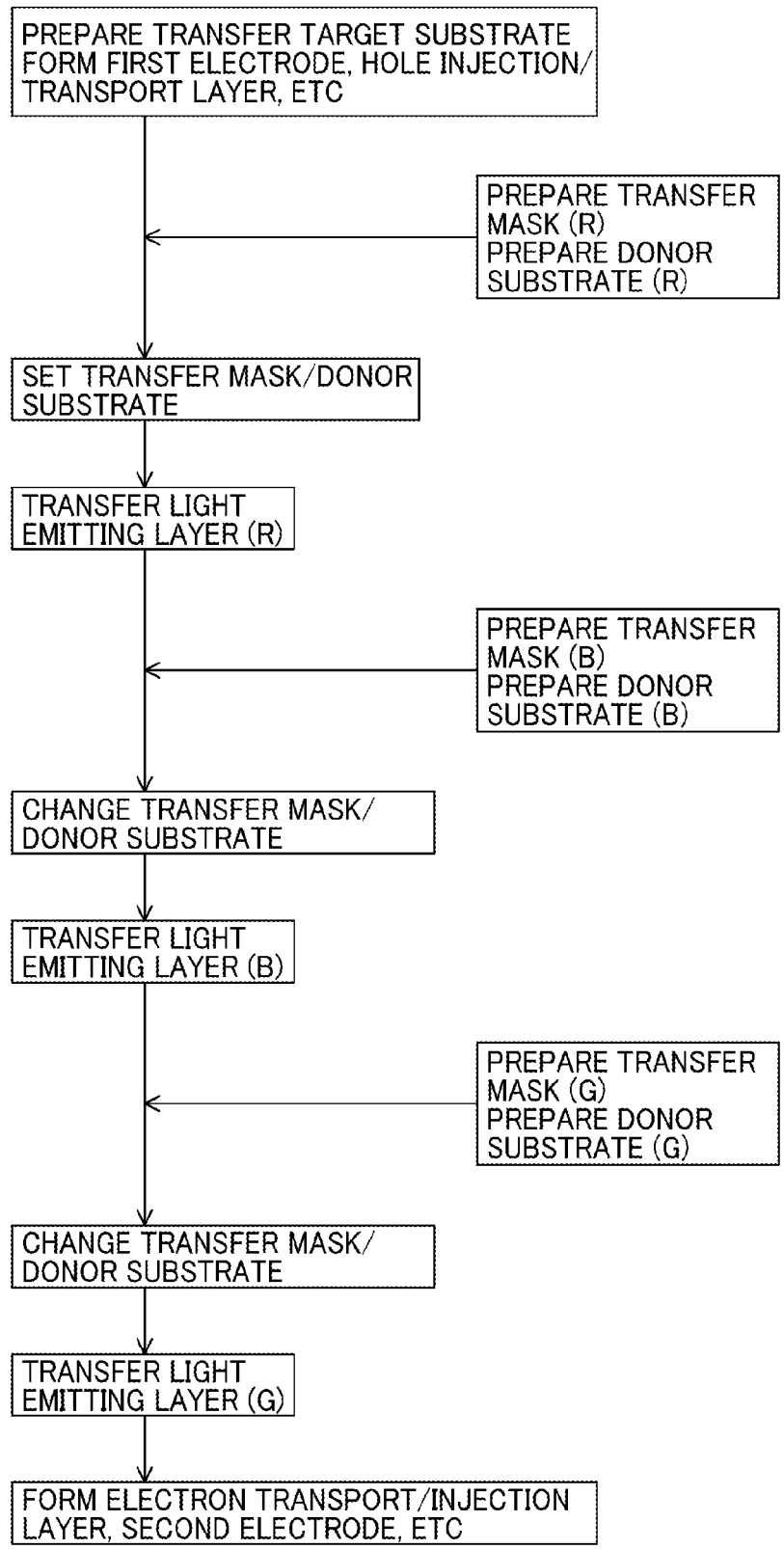
FIG. 3 shows a manufacturing process of an organic EL display device of the first embodiment.

FIGS. 1 and 2 show an organic EL display device 10 of the first embodiment. The organic EL display device 10 of this embodiment includes organic EL elements 15 each having a first electrode 12, an organic EL layer 13, and a second electrode 14 formed on top of another in this order on a substrate body 11, and such organic EL elements 15 are sealed with a sealing substrate. A manufacturing method of the organic EL display device 10 will be described hereinafter. FIG. 3 shows a manufacturing process of the organic EL display device 10 of the first embodiment.

<Transfer Target Substrate Preparation Process>

Figure 4:
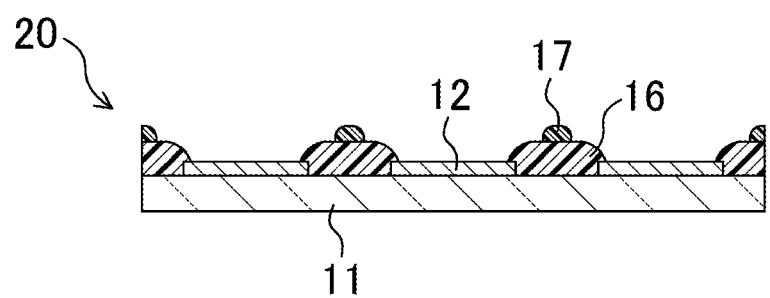
FIG. 4 is a cross-sectional view of a transfer target substrate.

First, a transfer target substrate 20 shown in FIG. 4 is prepared. The transfer target substrate 20 includes the first electrode 12, an edge cover 16, mask spacers 17, etc. formed on the substrate body 11.

(Substrate Body)

It is preferable that the substrate body 11 has an insulating surface. Examples of the substrate body 11 include a substrate formed of an inorganic material such as glass and quartz, a substrate formed of a plastic such as polyethylene terephthalate, a substrate formed of ceramic such as alumina, a substrate formed of a metal plate such as aluminum and iron coated with an insulator such as $SiO_2$ and an organic insulating material, and a substrate formed of a metal plate having a surface subjected to insulation processing by anodic oxidation, etc.

Circuits such as thin film transistors (TFTs) may be formed on the substrate body 11 by a known method, to provide a TFT substrate.

(First Electrode)

Subsequently, the first electrode 12 is formed on the substrate body 11 by sputtering, etc.

To form the first electrode 12, a conductive film is formed and then patterned into a desired shape and a desired size by a photolithographic process and etching. When the drive scheme of the organic EL display device 10 is a simple matrix scheme, the first electrode 12 has a shape of stripes. When the drive scheme of the organic EL display device 10 is an active matrix scheme having a TFT for each light emitting region P, the first electrode 12 has a pattern of islands to correspond to the light emitting regions P. Each island of the first electrode 12 is electrically connected to the corresponding TFT via a contact hole formed through an interlayer insulating film on the substrate body 11. The first electrode 12 has a thickness of about 100 nm, for example.

When the organic EL display device 10 is of a top emission type, a light reflective material is used as the material of the first electrode 12. When the organic EL display device 10 is of a bottom emission type or a both emission type, a light transmissive material or a transflective material is used as the material of the first electrode 12.

When the organic EL display device 10 is of the top emission type and uses the first electrode 12 as an anode, examples of the material of the first electrode 12 include conductive materials with high reflectance such as silver (Ag), aluminum (Al), chromium (Cr), iron (Fe), cobalt (Co), nickel (Ni), copper (Cu), tantalum (Ta), and tungsten (W) and alloys thereof. The first electrode 12 may also have a layered structure of a metal having a high work function such as any of the above materials, gold (Au), and platinum (Pt), and a conductive material with high transmittance such as transparent conductive materials like indium-tin-oxide (ITO), indium-zinc-oxide (IZO), IDIXO (indium oxide-indium-zinc-oxide), and $SnO_2$. When the organic EL display device 10 is of the bottom emission type or the both emission type, a transparent conductive material such as ITO, IZO, IDIXO, and $SnO_2$ is used as the material of the first electrode 12. When the first electrode 12 is used as a cathode, examples of the material constituting the first electrode 12 include materials having a low work function such as alloys of an active metal such as lithium (Li), magnesium (Mg), and calcium (Ca) and a metal such as Ag, Al, and indium (In), and multilayer structures thereof.

Note that when the first electrode 12 is used as a cathode, a compound layer made of a compound of an active metal such as Li, Mg, and Ca and any of halogen such as fluorine and bromine, oxygen, etc. may be formed on the surface of the first electrode 12. Such a compound layer may have a thickness of about 1 nm, for example, and have a function of allowing efficient injection of electrons from the cathode to an organic layer.

(Edge Cover and Mask Spacer)

Examples of the material of the edge cover 16 and the mask spacers 17 include: photosensitive organic insulating materials such as polyimide, acrylic resins, and a photoresist; and inorganic insulating materials such as silicon oxide. The edge cover 16 has a height of about 1 μm, for example, and the mask spacers 7 have a height of about 2 μm, for example.

The edge cover 16 and the mask spacers 17 are formed by a photolithographic process, for example. It is preferable to form the edge cover 16 and the mask spacers 17 simultaneously. For example, an acrylic resin, etc. is applied to have a layer having a thickness of about 2 μm, and then subjected to double exposure. The first exposure is performed with an intensity of about 200 mJ/cm², for example, to have a pattern of the edge cover 16, and the second exposure is performed with an intensity of about 40 mJ/cm², for example, to have a pattern of the mask spacers 17. The light-exposed layer is then developed and baked.

Regions on the first electrode 12 that are not covered with the edge cover 16 are defined as the light emitting regions P of the organic EL display device 10.

Placement of the mask spacers 17 will be described hereinafter.

It is preferable to place the mask spacers 17 on the four sides of each light emitting region P to surround the light emitting region P. With this four-side placement of the mask spacers 17, a transfer mask 40 can be held at a position apart from the light emitting region P by the distance equal to the height of the mask spacers 17, and thus a uniform distance is secured between the transfer target substrate 20 and the transfer mask 40, thereby permitting transfer of an organic layer with high precision. The mask spacers 17 may be placed to surround all the light emitting regions P, or placed more sparsely.

Figure 8:
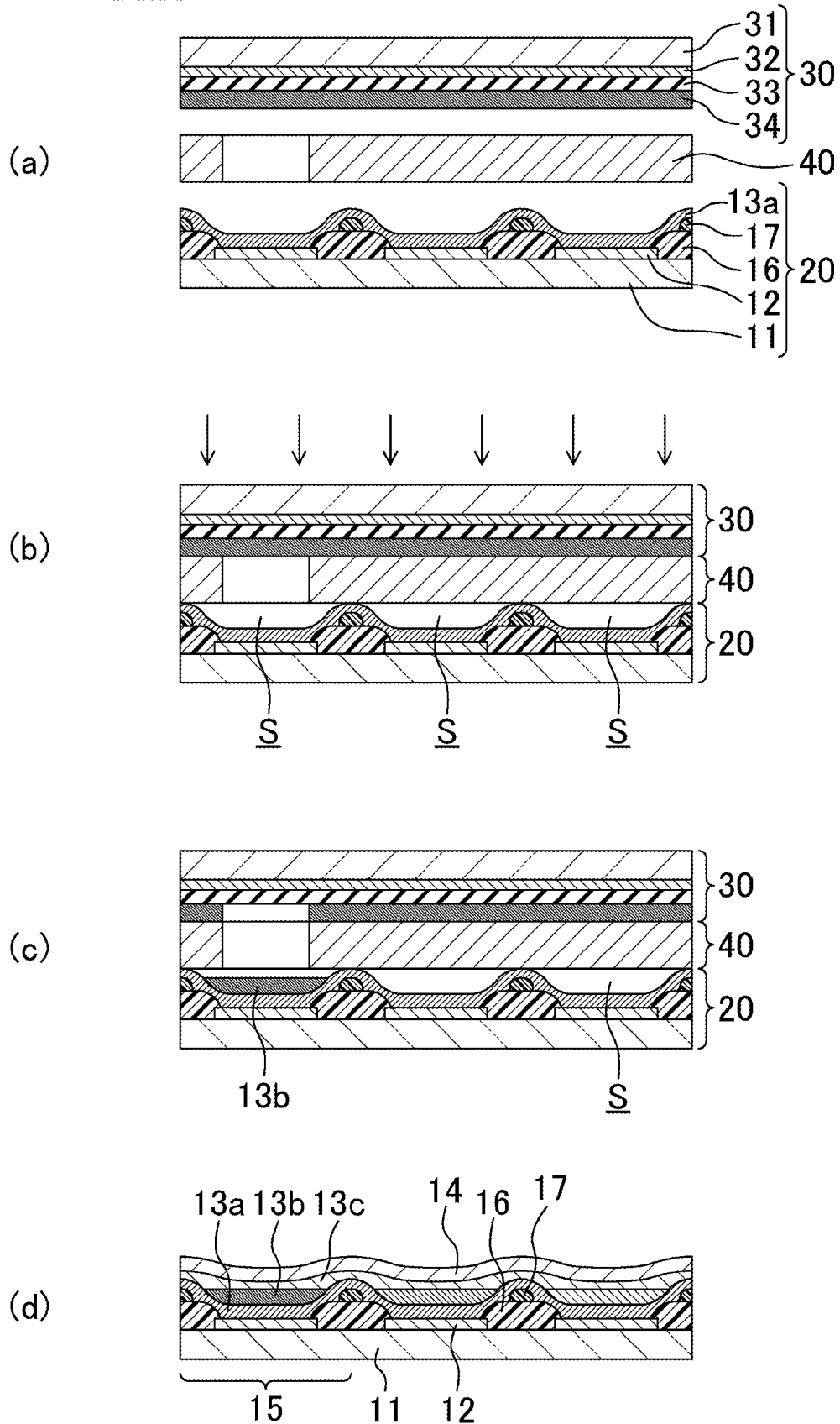
FIGS. 8A-8D are views illustrating a manufacturing method of the organic EL display device of the first embodiment

It is also preferable that the mask spacers 17 are not placed to surround the light emitting region P over the entire periphery. If the light emitting region P is surrounded with the mask spacers 17 completely, the space inside the light emitting region P will be isolated from the surrounding space at the time of superposition of the substrates in a transfer process. Thus, when space S between a donor substrate and the transfer target substrate is decompressed as shown in FIG. 8B, it will not be possible to uniformly decompress the partial spaces of the light emitting regions P surrounded by the mask spacers 17. Moreover, an organic material expands by heat generated at the time of transfer. In relation to this, since the partial spaces of the light emitting regions P surrounded by the mask spacers 17 are isolated from the surrounding space S, the pressure of the partial spaces of the light emitting regions P surrounded by the mask spacers 17 rises, causing imbalance in pressure between the partial spaces and the surrounding space.

Also, it is preferable that the space S is continuous space communicating with every part thereof at the time of superposition of the substrates. If the space S is not continuous, the space S will not be able to be decompressed uniformly at the time of superposition of the substrates in the transfer process.

Figure 5:
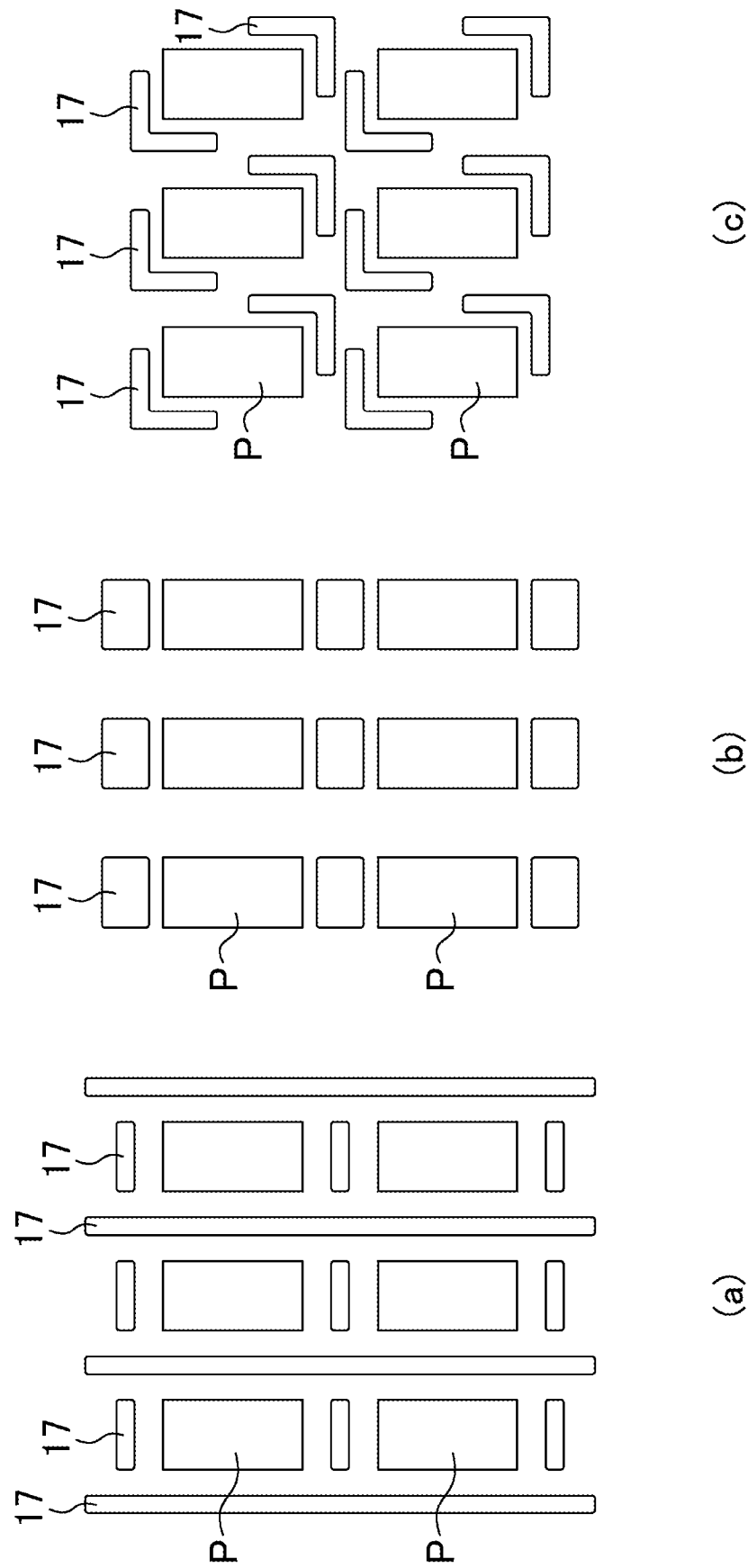
FIGS. 5A-5C show variations of arrangement of mask spacers in the plan view of the organic EL display device.

Examples of placement of the mask spacers 17 satisfying the condition described above include: striped placement as shown in FIG. 5A where the mask spacers 17 extend in parallel with one another in one direction on the substrate; columnar placement as shown in FIG. 5B where the mask spacers 17 extend upward from the substrate; and placement as shown in FIG. 5C where the mask spacers 17 are placed along corners of the light emitting regions P in the shape of letter L.

Note that, although the mask spacers 17 are not an essential component for solution of the problem to be addressed by the present disclosure, formation of the mask spacers 17 is preferable from the standpoint of preventing a hole transport layer, etc. on the transfer target substrate 20 from being damaged and also from the standpoint of holding the transfer mask 40 at a constant distance from the transfer target substrate 20.

In addition to the mask spacers 17, a peripheral spacer 18 may be placed in the peripheral region of the transfer target substrate 20 to surround the light emitting regions P and the mask spacers 17. Such a peripheral spacer 18 may be placed on one side, two opposing sides, two adjacent sides, three sides, or all the four sides, of the transfer target substrate 20.

When no mask spacers are placed in the peripheral region of the transfer target substrate 20, there is a possibility that the distance between the transfer mask 40 and the transfer target substrate 20 may become small, or even they may come into contact with each other, in the peripheral region of the transfer target substrate 20 at the time of superposition of the transfer target substrate 20 and the transfer mask 40. As a result, problems such as failure to decompress the space S sufficiently may occur. With the peripheral spacer 18 placed on the transfer target substrate 20, the transfer mask 40 can be supported by the peripheral spacer 18 in the peripheral region. Thus, the distance between the transfer target substrate 20 and the transfer mask 40 can be kept constant over the entire substrate surface, and as a result, the pressure of the space S can be made uniform more reliably. Therefore, transfer can be performed with higher precision with respect to the transfer position and thickness of the organic EL layer 13 transferred.

The peripheral spacer 18 is formed of the same material as the mask spacers 17, and have a width of 2 μm and a height of 1-3 μm, for example. It is preferable that the peripheral spacer 18 is placed somewhere in a region within 1 mm from the ends of the transfer target substrate 20.

It is also preferable that the peripheral spacer 18 is not placed to surround the periphery of the transfer target substrate 20 completely. If the peripheral spacer 18 is placed to surround the periphery of the transfer target substrate 20 completely, the space between the substrates surrounded by the peripheral spacer 18 will be isolated from the surrounding space at the time of superposition of the substrates in the transfer process, and thus uniform decompression will not be possible. Moreover, since the organic material expands by heat generated at the time of transfer, the pressure of the space inside the transfer target substrate 20, which is isolated from its surroundings, may rise, causing imbalance in pressure between the space and the surrounding space.

Figure 6:
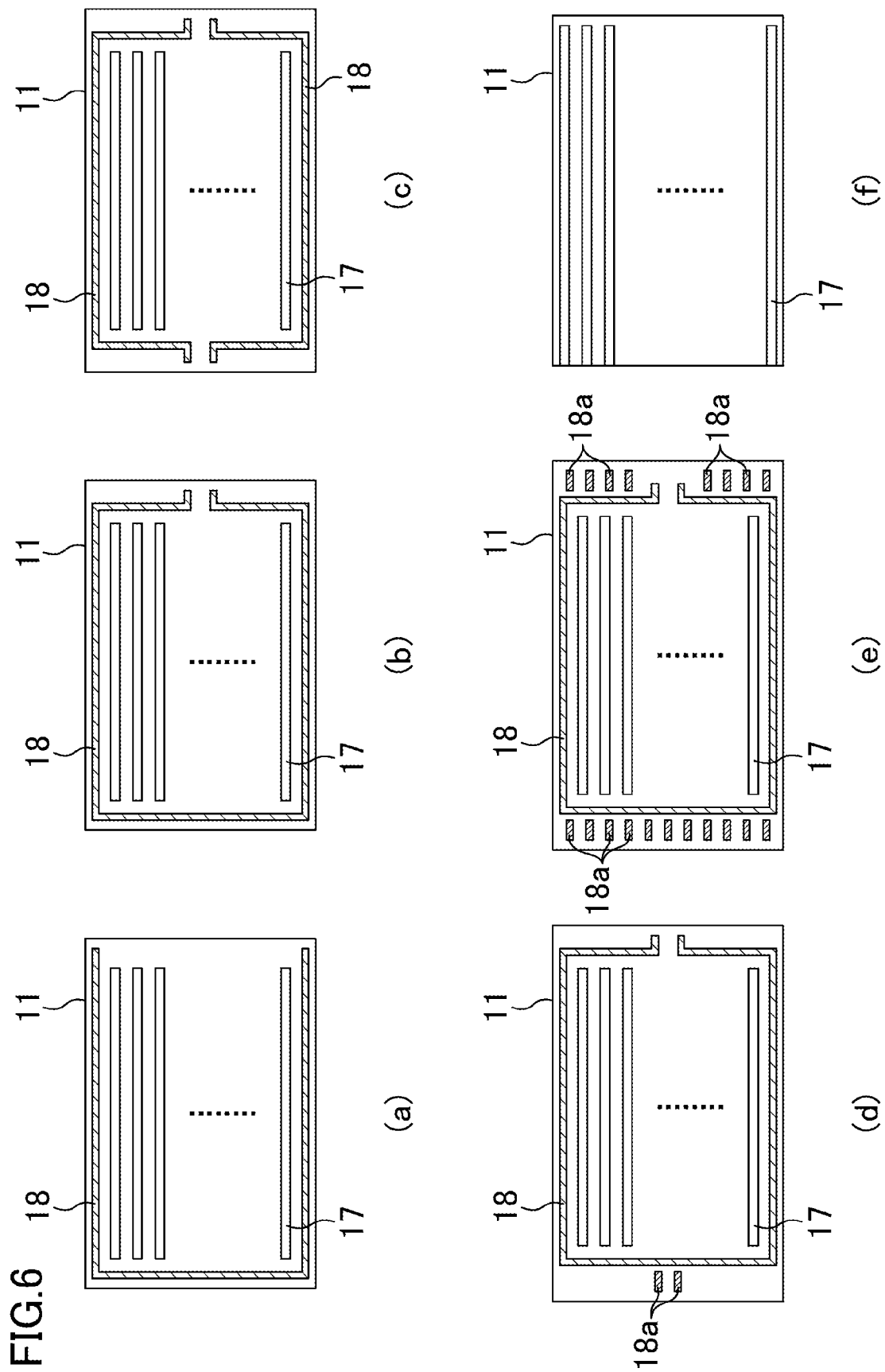
FIGS. 6A-6F show variations of arrangement of a peripheral spacer in the plan view of the organic EL display device.

FIGS. 6A and 6B show examples of placement of the peripheral spacer 18 provided to surround the mask spacers 17 formed on the transfer target substrate 20. In these cases, the peripheral spacer 18 is absent along a portion of the periphery (on the right side as viewed from FIGS. 6A and 6B) forming an opening, to allow the space S to be continuous. Note that a jig may be placed at the opening at the time of superposition of the substrates, as required, to assist the substrates to maintain the opposed state.

It is preferable to place the peripheral spacer 18 to have a symmetric layout on the transfer target substrate 20. With the peripheral spacer 18 placed with symmetry, the pressure of the space S can be made uniform easily over the entire substrate surface, and as a result, occurrence of unevenness in the formation of the transferred film can be prevented or reduced. For example, by forming two openings as shown in FIG. 6C, the symmetry of the layout of the peripheral spacer 18 can be more enhanced compared with the layout of FIG. 6B.

Moreover, to enhance the symmetry of the layout of the peripheral spacer 18, auxiliary spacers 18a may be provided in addition to the peripheral spacer 18. For example, in addition to the peripheral spacer 18 in the layout of FIG. 6B, auxiliary spacers 18a can be placed at the end opposite to the opening, as shown in FIG. 6D. Alternatively, the symmetry may be enhanced by providing auxiliary spacers 18a in edge regions outside the peripheral spacer 18, as shown in FIG. 6E.

Instead of providing the peripheral spacer 18 as a member different from the mask spacers 17, the mask spacers 17 in stripes may be extended to the peripheral portions of the transfer target substrate 20, to impart the function of the peripheral spacer 18 to the mask spacers 17.

After formation of the edge cover 16 and the mask spacers 17, the surface of the first electrode 12 is cleaned by UV-ozone processing, etc., for example. In the UV-ozone processing, ultrasonic cleaning is performed using acetone, isopropyl alcohol, etc. for about ten minutes, for example, and thereafter UV-ozone cleaning is performed for about 30 minutes.

(Hole Injection Layer/Hole Transport Layer)

Next, a hole injection layer and a hole transport layer are formed to cover the entire surface of the substrate using vapor deposition.

Examples of the material of the hole injection layer include copper phthalocyanine (CuPc), polyaniline (PANI), 3,4-polyethylenedioxythiophene/polystyrenesulfonate (PEDOT/PSS), and 4,4',4"-tris[(3-methylphenyl)phenylamino]triphenylamine (m-MTDATA).

Examples of the material of the hole transport layer include: aromatic tertiary amine compounds such as N,N'-bis-(3-methylphenyl)-N,N'-bis-(phenyl)-benzidine (TPD) and N,N'-di(naphthalene-1-yl)-N,N'-diphenyl-benzidine (α-NPD); porphyrin compounds; hydrazone compounds; low-molecular materials such as quinacridone compounds and styrylamine compounds; high-molecular materials such as poly[triphenylamine derivatives] (Poly-TPD) and polyvinylcarbazole (PVCz); high-molecular material precursors such as poly(p-phenylene vinylene) precursors (Pre-PPV) and poly(p-naphthalene vinylene) precursors (Pre-PNV); and inorganic p-type semiconductor materials.

The hole transport layer may be formed after formation of the hole injection layer. Alternatively, an organic layer made of any of the materials for the hole transport layer listed above may be formed as a hole injection/transport layer 13a. Such a hole injection/transport layer 13a has a thickness of about 30 nm, for example.

<Donor Substrate/Transfer Mask Preparation Process>

(Donor Substrate)

Figure 7:
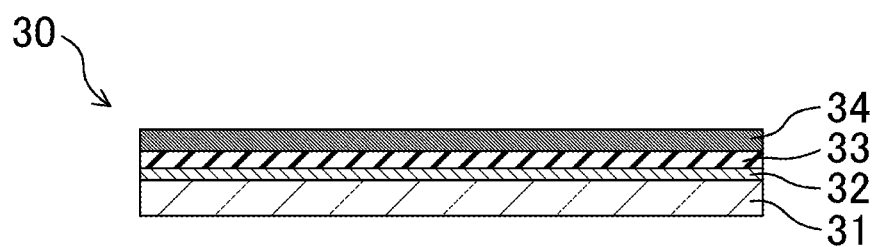
FIG. 7 is a cross-sectional view of a donor substrate in the first embodiment.

Next, the donor substrate 30 is prepared. FIG. 7 is a cross-sectional view of the donor substrate 30. First, a light heat converting layer 32 is formed on the entire surface of a support plate 31 by sputtering deposition, electron beam evaporation, resistance heating evaporation, etc., and then coated with a protection film 33 by chemical vapor deposition (CVD), sputtering, etc., for example.

The support plate 31 is formed of a material capable of transmitting radiation emitted in the transfer process, e.g., an inorganic material such as glass and quartz, a plastic such as polyethylene terephthalate, etc. It is preferable that the support plate 31 has an insulating surface portion and is formed of a material small in thermal expansion.

The light heat converting layer 32 has a function of converting light energy of radiation to heat energy. Examples of the material of the light heat converting layer 32 include: metals having a low reflectance and a high melting point such as titanium (Ti), molybdenum (Mo), and chromium (Cr); and resins containing carbon black, organic pigments, etc. It is preferable that the material of the light heat converting layer 32 is high in light-heat conversion efficiency and has a melting point or decomposition temperature as high as 300° C. or more. If the melting point or decomposition temperature of the light heat converting layer 32 is less than the above temperature, there are possibilities, not only that the donor substrate 30 may be damaged and unable to be used repeatedly, but also that part of the light heat converting layer 32 may enter the organic layer of the transfer target substrate as an impurity, degrading the characteristics of the organic EL elements 15. The light heat converting layer 32 has a thickness of about 200 nm, for example, and has a thermal conductivity of 20-500 W/m·K, for example.

The protection layer 33 has a function of preventing the light heat converting layer 32 from being damaged during transfer and during cleaning of the donor substrate 30. Examples of the material of the protection layer include inorganic materials such as silicon oxide ($SiO_x$) and silicon nitride ($SiN_x$). The protection layer has a thickness of about 100 nm, for example.

Thereafter, a transfer layer 34 is formed on the support plate 31. Note that the transfer material to be used as the transfer layer 34 is a light emitting material that is to be an emitting layer 13b of the organic EL layer 13.

The transfer layer 34 is formed by vacuum evaporation, spin coating, etc., for example. The transfer layer 34 has a thickness of 50 nm, for example.

It is preferable to use a low-molecular compound having a molecular weight of about 2000 or less as the transfer material for the transfer layer 34 from the standpoint of reducing the intermolecular interaction to a minimum and ensuring stable sublimation and uniform transfer to the transfer target substrate. It is preferable that the transfer material has a vaporizing temperature of 100-500° C. under a pressure of $10^{-3}$ Pa, for example. If the vaporizing temperature is less than 100° C., there are possibilities that molecules of the transfer material having adhered to the transfer target substrate may be vaporized again and that the heat resistance of the prepared organic EL elements 15 may be reduced. Contrarily, if the vaporizing temperature is more than 500° C., there are possibilities that thermal decomposition may occur during sublimation and that the donor substrate may be damaged because the necessary energy of radiation used for transfer becomes high. Examples of the transfer material include: 4,4'-bis[N-(1-naphtyl)-N-phenylamino]biphenyl (α-NPD), tris(8-quinolinolato)aluminum(III) (Alq3), 4,4'-bis[N-(9,9-dimethylfluoren-2-yl)-N-phenylamino]biphenyl (DFLD-PBi), bis(2-methyl-8-quinolinolato)(4-phenylphenolate)aluminum(III) (BAlq), etc.; aromatic dimethylidine compounds such as 4,4'-di(9-carbazolyl)biphenyl (CBP), 2-tert-butyl-9,10-di(2-naphthyl)anthracene (t-BuDNA), 9-[4-(9-Carbazolyl)phenyl]-10-phenylanthracene (CzPA), and 4,4'-bis(2,2'-diphenylvinyl)-biphenyl (DPVBi); oxadiazole compounds such as 5-methyl-2-[2-[4-(5-methyl-2-benzoxazolyl)phenyl]vinyl]benzoxazole; triazole derivatives such as 3-(4-biphenylyl)-4-phenyl-5-t-buthylphenyl-1,2,4-triazole (TAZ); styrylbenzene compounds such as 1,4-bis(2-methylstyryl)benzene; fluorescent organic materials such as tiopyrazine dioxide derivatives, benzoquinone derivatives, naphthoquinone derivatives, anthraquinone derivatives, diphenoquinone derivatives, and fluorenone derivatives; azomethine-zinc complexes; phosphorescent compounds such as (acetylacetonate)bis(2,3,5-triphenylpyridinato)Iridium(III) (Ir(tppr)$_2$(acac)), bis[2-(4',6'-difluorophenyl)-pyridinato-N,C2']Iridium(III)picolinate (FIrpic), tris-(2-phenylpyridinato-N,C2')iridium(III) (Ir(ppy)$_3$), bis-(2-phenylpyridinato-N,C2')iridium(III)acetylacetonate (Ir(ppy)$_2$(acac)), bis(2-phenyl benzothiozolato-N,C2')iridium(III)acetylacetonate (Ir(bt)$_2$(acac)), tris-(2-phenylquinolinato-N,C2')iridium(III) (Ir(pq)$_3$), bis(2-phenylquinolinato-N,C2')iridium(III)acetylacetonate (Ir(pq)$_2$(acac)), bis(2-(2'-benzo[4,5-α]thienyl)-pyridinato-N,C3')iridium(III)acetylacetonate (Ir(btp)$_2$(acac)), bis(1-phenylisoquinolinato-N,C2')iridium(III)acetylacetonate (Ir(piq)$_2$(acac)), (acetylacetonate)bis[2,3-bis(4-fluorophenyl)quinoxalinato]iridium(III) ((Ir(Fdpq)$_2$(acac)), and platin(um?)(II)-2,3,7,8,12,13,17,18-octaethyl-21H,23H-porphyrine (PtOEP); and fluorescent compounds such as perylene, 2,5,8,11-tetra(tert-buthyl)perylene (TBP), 4,4'-bis[2-(N-ethylcarbazol-3-yl)vinyl]biphenyl (BCzVBi), 5,12-diphenyltetracene, N,N'-dimethylquinacridone (DMQd), N,N'-diphenylquinacridone (DPQd), 4-dicyanomethyle-2-isopropyl-6-[2-(1,1,7,7-tetramethyljulolidine-9-yl)ethenyl]-4H-pyran (DCJTI), rubrene, coumarin 6, and coumarin 30.

When CBP is used as the host material of the emitting layer 13b and an iridium complex as the dopant material, a red emitting layer 13b, a green emitting layer 13b, and a blue emitting layer 13b can be formed independently by changing the composition of the iridium complex.

The donor substrate 30 is thus prepared by following the above process.

(Transfer Mask)

Next, the transfer mask 40 is prepared. The transfer mask 40 has openings at positions corresponding to organic layer formation regions. Since the transfer mask 40 is secured by being sandwiched between the donor substrate 30 and the transfer target substrate 20 in the transfer process, the transfer mask 40 itself may or may not be provided with a support mechanism.

It is preferable that the transfer mask 40 is made of a material lower in thermal conductivity than the light heat converting layer 32. For example, Invar steel (thermal conductivity: about 14 W/m·K), etc. may be used. With such a material, it is possible to prevent or reduce occurrence of a problem that energy converted to heat by the light heat converting layer 32 may be conducted to the transfer target substrate 20 causing damage to the hole transport layer, etc. formed on the transfer target substrate 20.

The transfer mask 40 has a thickness of 10-500 μm, for example. By increasing the thickness of the transfer mask 40, the effect of preventing or reducing conduction of energy converted to heat by the light heat converting layer 32 to the transfer target substrate 20 can be increased. Also, by changing the thickness of the transfer mask 40, the distance between the donor substrate 30 and the transfer target substrate 20 can be adjusted, permitting adjustment of the thickness of the organic layer formed.

The transfer mask 40 is provided with alignment markers for positioning between the transfer target substrate 20 and the transfer mask 40.

<Transfer Process>

(Superposition of Substrates)

Next, as shown in FIG. 8A, the transfer mask 40 is bonded to the donor substrate 30, and is opposed to the transfer target substrate 20. At this time, the transfer mask 40 and the transfer target substrate 20 are aligned with each other using the alignment markers provided on the transfer mask 40.

The transfer mask 40 is superposed on the donor substrate 30 in the state of being in complete contact with the transfer layer 34-side surface of the donor substrate 30. Also, the transfer mask 30 is superposed on the transfer target substrate 20 so that the mask spacers 17 formed on the transfer target substrate 20 are in contact with the transfer mask 40. Thus, the distance between the donor substrate 30 and the transfer target substrate 20 is the sum of the spacer height of the mask spacers 17 and the thickness of the transfer mask 40, which is 12-502 μm, for example.

As described above, since the donor substrate 30, the transfer mask 40, and the transfer target substrate 20 are superposed on one another so that they are in contact with each other, it is easy to hold them compared with the case where they are in the non-contact state. Therefore, deviation is not likely to occur in relative positions among the substrates and the mask, and thus excellent transfer precision can be ensured. Also, since the distance between the two substrates can be determined with the thickness of the transfer mask 40, the thickness of the organic layer formed, etc. can be easily designed. Moreover, since no jig, etc. is unnecessary for holding the substrates and the mask, the size of the entire apparatus can be reduced.

(Decompression of Space S)

After the donor substrate 30, the transfer mask 40, and the transfer target substrate 20 have been superposed on one another, they are placed in a vacuum chamber in the superposed state. Then, the entire vacuum chamber is decompressed to have a pressure of about $10^{-3}$ Pa inside the chamber. The chamber is first decompressed by about 1 Pa using an oil-free dry pump, for example, and then further decompressed to about $10^{-3}$ Pa using a magnetically-suspended turbo molecular pump, a complex molecular pump, a cryogenic pump, etc. The substrates, etc. may be placed in the vacuum chamber after having been superposed on one another, or may be superposed on one another inside the vacuum chamber.

Subsequently, a cramping frame (not shown) is attached to the edge portions of the donor substrate 30 and the transfer target substrate 20, to isolate the space S between the two substrates from the space in the vacuum chamber. Thereafter, the decompressed state in the vacuum chamber is relieved to about 1 Pa while the pressure in the space S is kept at about $10^{-3}$ Pa.

Thus, with the pressure in the space S being lower than the surrounding pressure in the vacuum chamber, the space S is sealed by the pressure. With the two substrates being in intimate contact with each other by the force generated by the difference between the pressures inside and outside the space S, a uniform force is applied to the entire substrate surface, and thus the substrates can be maintained with a uniform distance therebetween over the entire substrate surface.

By reducing the pressure in the space S to about $10^{-3}$ Pa, the vaporization start temperature of the transfer material decreases, increasing the transfer efficiency. Moreover, with the low pressure in the space S of about $10^{-3}$ Pa, the possibility that the organic material on the transfer target substrate 20 may be damaged can be prevented or reduced.

The method of bringing the two substrates into intimate contact with each other using the difference between the pressures inside and outside the space described above is advantageous when the space S is continuous over the entire substrate surface. When the space S is not continuous, however, it is difficult to maintain a uniform pressure over the discontinuous space, and a physical force must be applied to hold the two substrates in the superposed state. In this case, a vacuum chamber equipped with a surface plate for pressure application and a cushion ring may be used, for example. After the distance between the vacuum chamber and the surface plate is adjusted using the cushion ring, a pressure is applied to the substrates by the surface plate, to keep a uniform distance between the substrates.

The position of the surface plate itself may be adjusted, and then the substrates may be brought into intimate contact with each other. Otherwise, the substrates may be brought into intimate contact with each other in any other way.

(Irradiation with Radiation)

After the decompression of the space S to bring the substrates into intimate contact with each other, the donor substrate 30 is irradiated with radiation from the support plate 31-side thereof, as shown in FIG. 8B, to allow the transfer layer 34 to be transferred onto the transfer target substrate 20, forming an organic layer (organic EL layer 13).

As the radiation, laser light, halogen lamp light, flash lamp light, etc. may be used.

When a laser light source is used as the radiation source, irradiation is performed under the conditions of a laser wavelength of 808 nm, a laser output of 3 W, an irradiation density of the laser-irradiated surface of the donor substrate 30 of 100 mW/cm$^2$, and an irradiation time of 100 m/sec. The irradiation conditions should be appropriately adjusted depending on the kind and thickness of the organic layer formed. It is preferable that the laser light source is a surface light source to allow one-time irradiation of the entire substrate surface. If the laser light source is not a surface light source and irradiates the substrate by scanning over the surface sequentially, problems such as a non-uniform beam profile due to deflection in scanning, fluctuations in focal distance, etc. may occur, failing to irradiate the entire substrate surface averagely, and thus causing unevenness in the formation of the transferred organic layer. By irradiating the entire substrate surface as described above, such a problem can be solved. Also, since it is unnecessary to scan the surface with the radiation source, the work time can be shortened.

When flash lamp light is used as the radiation, irradiation is performed under the conditions of an irradiation energy density of 2 J/cm$^2$ and a pulse width of 10 msec. In this case, also, as in the case of using the surface laser light source, the entire substrate surface can be irradiated.

(Formation of Organic Layer)

When the donor substrate 30 is irradiated with radiation, the light heat converting layer 32 absorbs the light and converts the light energy to heat energy. With this heat energy, the transfer material of the transfer layer 34 of the donor substrate 30 is heated and, once heated to its vaporization start temperature, vaporizes and is released to the space S. At this time, portions of the transfer material that has succeeded in passing through the openings of the transfer mask 40 reach the surface of the transfer target substrate 20, and, as shown in FIG. 8C, coagulate by cooling, thereby adhering to the substrate surface and accumulating to form the organic layer.

Figure 9:
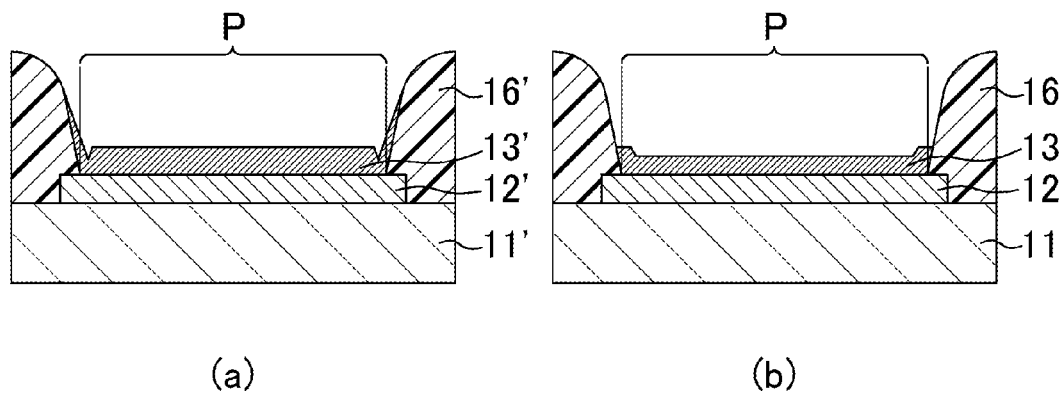
FIGS. 9A and 9B are enlarged cross-sectional views of a main portion of a conventional organic EL display device and the organic EL display device of the first embodiment, respectively.

When an organic layer is formed using vacuum evaporation, evaporated matter will be scattered radially from an evaporation source because the distance between the evaporation source and an evaporation target substrate is long. Therefore, as shown in FIG. 9A, the resultant organic layer may be thinned at the ends of the light emitting region P. At such thinned portions, there is a possibility that the first electrode 12 and the second electrode 14 may become conductive with each other, causing failure in light emission by the light emitting region P. Another problem is that, because the evaporated matter is scattered radially from the evaporation source, the evaporated matter (light emitting material) may adhere to the walls of the edge cover 16 formed to surround each pixel region. Therefore, there is a possibility that, when light is emitted by an adjacent light emitting region P, for example, the light emitting material having adhered to the walls of the edge cover 16 may be excited and emit light under internal reflected light of the emitted light, causing color mixture and contrast reduction.

In this embodiment, however, in which the organic EL layer 13 is formed by transfer, the donor substrate 30 and the transfer target substrate 20 are superposed on each other via the transfer mask 40 so that they are in contact with each other. Therefore, the distance between the donor substrate 30 and the transfer target substrate 20 is short, allowing the light emitting material to reach the transfer target substrate 20 after having scattered roughly vertically. Thus, the problem that the resultant layer becomes thin at edge portions of each light emitting region P, which occurs when the light emitting material scatters radially, will not occur. Instead, as shown in FIG. 9B, the organic EL layer 13 uniform in thickness over the entire surface of the light emitting region P can be formed.

Also, in this embodiment, the light emitting material reaches the transfer target substrate 20 after having scattered roughly vertically, and adherence of the transfer material, i.e., the light emitting material, to the walls of the edge cover 16 can be easily prevented or reduced by adjusting the design of the openings of the transfer mask 40. Therefore, it is possible to prevent or reduce occurrence of the problem that, in a light emitting region P that is not expected to emit light, the light emitting material is excited and emits light under internal reflected light from another light emitting region P because of the adhesion of the light emitting material to the walls of the edge cover 16, causing color mixture and contrast reduction.

In this transfer process, the donor substrate 30 and the transfer mask 40 are superposed on each other so as to be in intimate contact with each other, and the transfer mask 40 and the transfer target substrate 20 are superposed on each other with the mask spacers 17 serving as supports. Therefore, occurrence of a deviation from these superposed states is prevented or reduced. This prevents or reduce adherence of the organic layer to any portion other than the desired organic layer formation regions, and thus permits formation of a high-precision organic layer.

It is preferable that the transfer mask 40 is lower in thermal conductivity than the light heat converting layer 32. With the reduced thermal conductivity, the converted heat energy from the light heat converting layer 32 is not easily conducted to the transfer target substrate 20, and thus temperature rise in the transfer mask 40 can be prevented or reduced. Therefore, occurrence of the problem that the transfer target substrate 20 may be heated and thus damaged can be prevented or reduced.

Note that the transfer process described above is performed for the red light emitting regions P, the green light emitting regions P, and the blue light emitting regions P independently.

<Second Electrode, Etc Formation Process>

(Electron Transport Layer and Electron Injection Layer)

Following the transfer process described above, the transfer target substrate 20 is removed from the transfer apparatus, and as shown in FIG. 8D, an electron transport layer is formed by vacuum evaporation, etc. As the material of the electron transport layer, a general electron transport material such as Alq3 may be used. The electron transport layer has a thickness of about 60 nm, for example.

A hole blocking layer may be formed between the organic EL layer 13 and the electron transport layer. The hole blocking layer has a function of blocking holes from being transported to the second electrode 14 side. Examples of the hole blocking layer include bis(2-methyl-8-quinolinolato)(p-phenylphenolate)aluminum(III) (BAlq), 2,9-dimethyl-4, and 7-diphenyl-1,10-phenanthroline (BCP). The hole blocking layer has a thickness of about 10 nm, for example.

On the electron transport layer, an electron injection layer may be formed by vacuum evaporation, etc. As the material of the electron injection layer, a general electron injection material such as lithium fluoride (LiF) may be used. The electron injection layer has a thickness of about 1 nm, for example.

Note that, although an electron transport/injection layer 13c is formed by vacuum evaporation in the illustrated example, it may be formed by transfer in the preceding transfer process.

(Second Electrode)

Next, the second electrode 14 is formed on the electron injection layer by vacuum evaporation, etc. When the organic EL display device 10 adopts the simple matrix scheme, the second electrode 14 is in the shape of stripes extending in the direction intersecting the stripes of the first electrode 12, for example, and the intersections between the stripes of the first electrode 12 and the first electrode 14 serve as the light emitting regions P. When the organic EL display device 10 adopts the active matrix scheme, the second electrode 14 is formed over the entire substrate surface and used as a common electrode for all the light emitting regions P. The second electrode 14 has a thickness of about 100 nm, for example.

When the organic EL display device 10 is of a top emission type or a both emission type, a light transmissive material or a transflective material, such as ITO and IZO, is used as the material of the second electrode 14. When the organic EL display device 10 is of a bottom emission type, a light reflective material such as aluminum (Al) is used as the material of the second electrode 14.

(Sealing)

Finally, the substrate and sealing glass are bonded together to seal the organic EL elements 15. An UV-curable resin, etc. may be used for the bonding between the substrate and the sealing glass. Also, a drying material may be affixed to the inside of the sealing glass for preventing the organic EL elements 15 from being damaged from water, etc.

Through the processes described above, the organic EL display device 10 of this embodiment can be manufactured.

In the case that the organic EL display device 10 is driven with TFTs, for example, when a TFT is turned on with a signal input from an interconnect, holes are injected from the first electrode 12 to the organic EL layer 13, and also electrons are injected from the second electrode 14 to the organic EL layer 13. Such holes and injections recombine in the emitting layer 13b. Deactivation energy released when the electrons excited by the recombination return to their ground state is taken out as light emission. By controlling the emission brightness in each light emitting region P, the organic EL display device 10 can display a given image.

Figure 10:
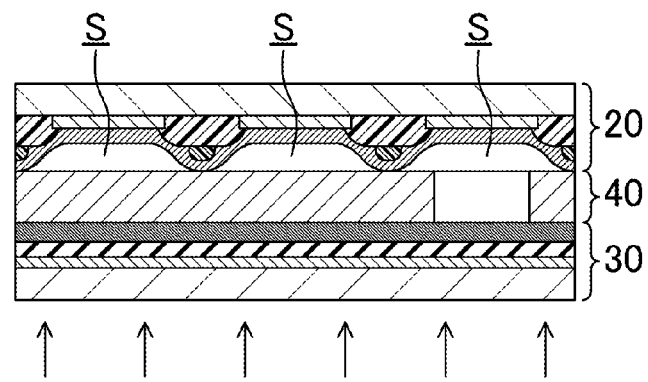
FIG. 10 illustrates a manufacturing method of an organic EL display device of a variation of the first embodiment.

In the above description of this embodiment, the transfer is performed in the state of the donor substrate 30 being superposed on the transfer target substrate 20. Alternatively, as shown in FIG. 10, the transfer target substrate 20 may be superposed on the donor substrate 30 with the transfer mask 40 therebetween, to form the organic EL layer. In this case, also, since the transfer target substrate 20 and the transfer mask 40, and the donor substrate 30 and the transfer mask 40, are superposed on each other so that they are in contact with each other, the distance between the transfer target substrate 20 and the donor substrate 30 can be reduced, and also can be kept constant over the entire substrate surface. Thus, the organic EL layer can be formed with excellent transfer precision.

Second Embodiment

Figure 11:
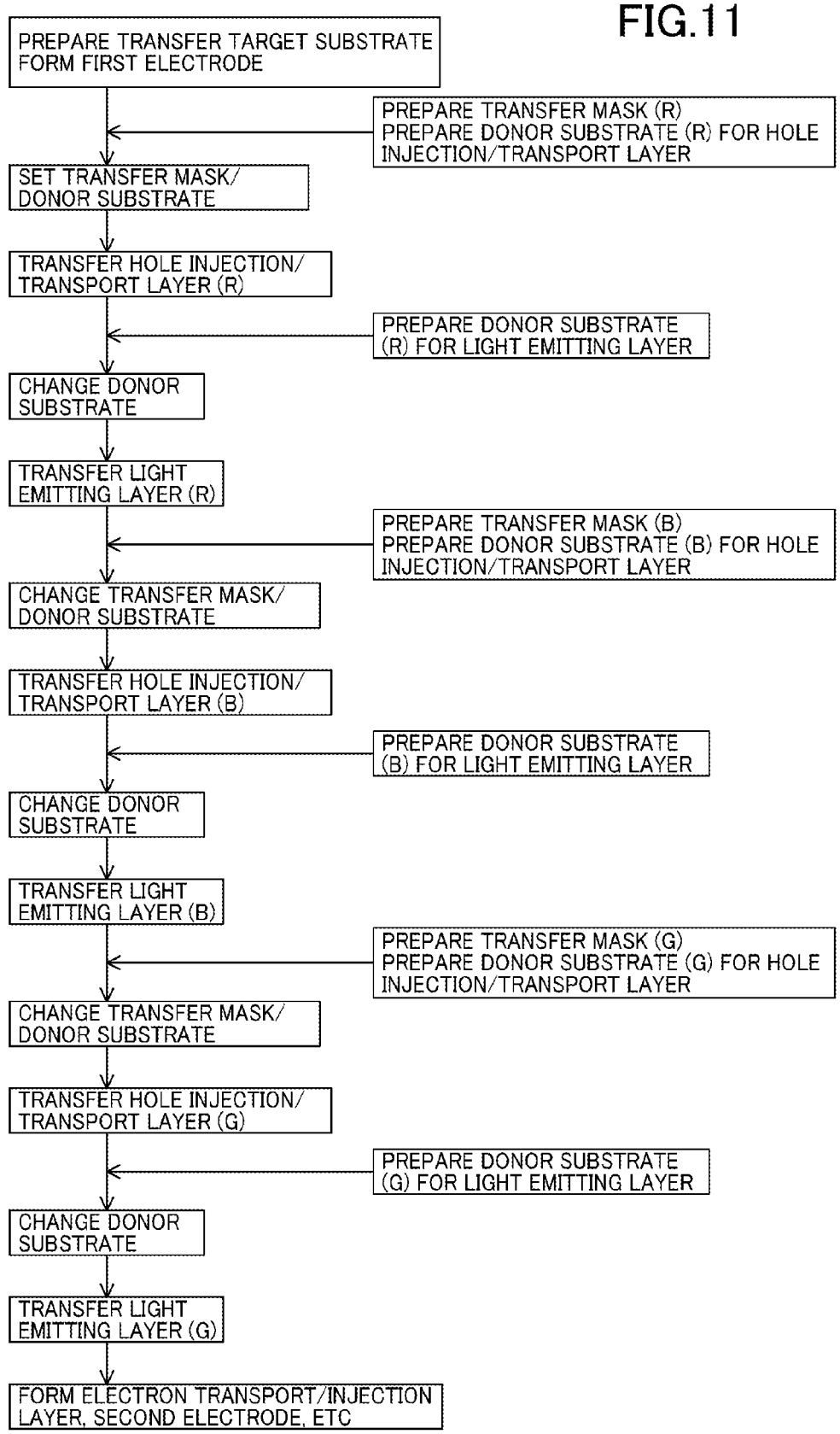
FIG. 11 shows a manufacturing process of an organic EL display device of the second embodiment.

FIG. 11 shows a manufacturing process of an organic EL display device 10 of the second embodiment.

The organic EL display device 10 of this embodiment is a display device of the top-emission type with a micro-cavity structure, where a first electrode 12 is a reflective electrode and a second electrode 14 is a transflective electrode. The first electrode 12 has a layered structure of an Al film having a thickness of 100 nm and an IZO film having a thickness of 10 nm, for example. The second electrode 14 is made of an IZO film having a thickness of 20 nm, for example.

In the micro-cavity structure type organic EL display device 10, the transflective electrode transmits only light having a predetermined wavelength, and by a resonance action occurring between the two electrodes, the half-width of the emission spectrum is reduced, whereby light emission with sharp brightness can be taken out. With this micro-cavity effect, it is possible to obtain advantages that the color purity improves when viewed from the front and that the front brightness improves. The optimum micro-cavity effect can be obtained by controlling the wavelength of the emission spectrum, the refractive index of the organic layer, the distance between the electrodes, etc. For example, portions of a hole injection/transport layer 13a in red light emitting regions P, green light emitting regions P, and blue light emitting regions P are made to have thicknesses of 50 nm, 100 nm, and 150 nm, respectively. The optimum micro-cavity effect can otherwise be obtained by adjusting the thicknesses of an electron transport/injection layer 13c in place of the hole transport/injection layer 13a.

<Transfer Target Substrate Preparation Process>

First, the first electrode 12, an edge cover 16, and mask spacers 17 are formed on a substrate body 11 in a manner similar to that in the first embodiment, to obtain a transfer target substrate 20.

<Transfer Process>

Figure 12:
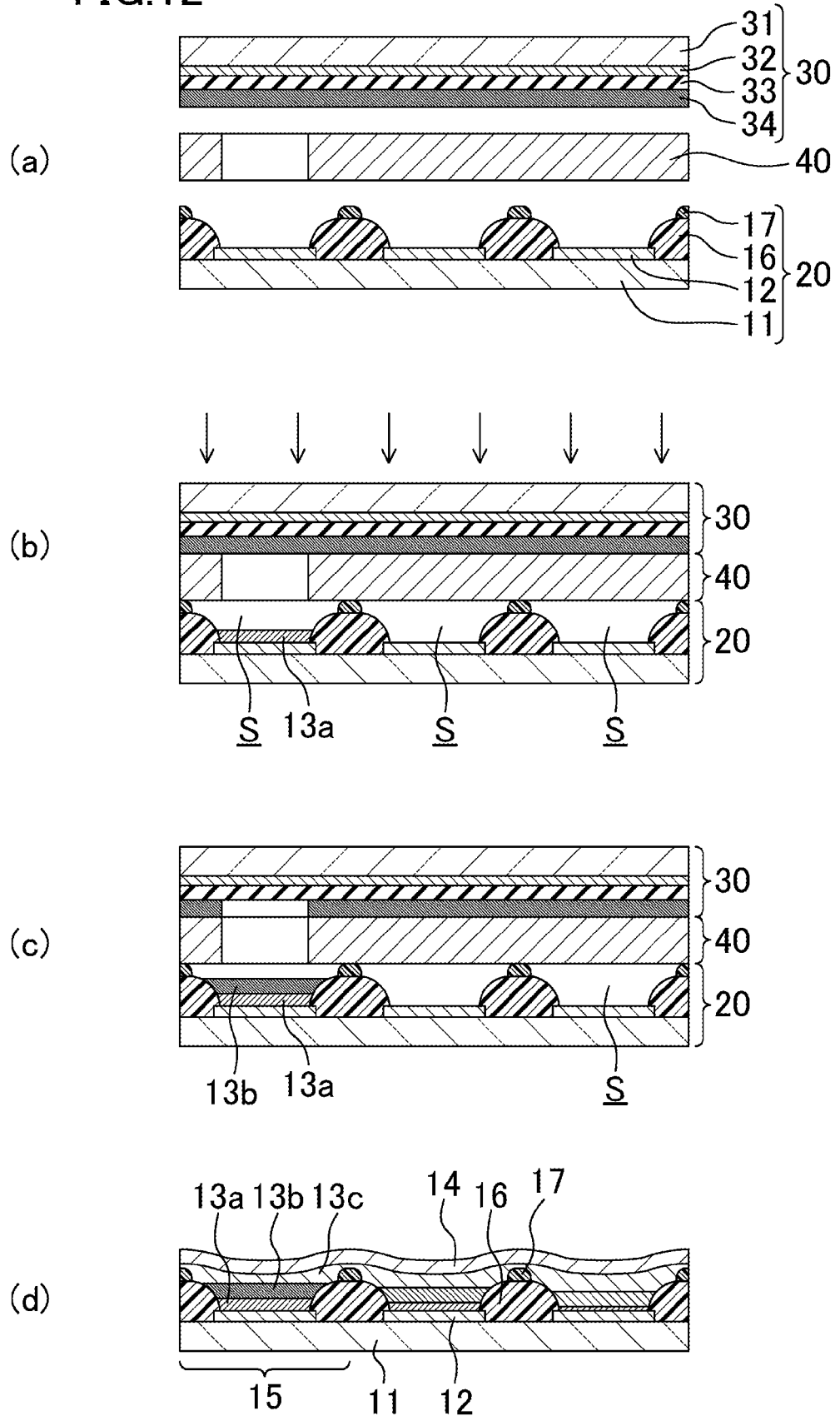
FIGS. 12A-12D are views illustrating a manufacturing method of the organic EL display device of the second embodiment

Next, as shown in FIGS. 12A-12C, a donor substrate 30, a transfer mask 40, and the transfer target substrate 20 are superposed on one another, and subjected to transfer process.

First, the hole transport/injection layer 13a is formed in each red light emitting region P as an organic layer by transfer. The details of the transfer process are similar to those in the first embodiment.

Subsequently, the donor substrate 30 is changed, and an emitting layer 13b made of a red light emitting material is formed in each red light emitting region P as an organic layer. At this time, the same transfer mask 40 as that used for formation of the hole transport/injection layer 13a can be used as it is.

Thereafter, the donor substrate 30 and the transfer mask 40 are changed, and the hole transport/injection layer 13a and the emitting layer 13b are formed in each green light emitting region P. This also applies to each blue light emitting region P.

Although the hole transport/injection layer 13a and the emitting layer 13b are formed in the red light emitting regions P, the green light emitting regions P, and the blue light emitting regions P in this order in the above description, the formation may be started from the green light emitting regions P or the blue light emitting regions P.

<Second Electrode, Etc Formation Process>

After the formation of the hole injection/transport layer 13a and the emitting layer 13b in each of the red light emitting regions P, the green light emitting regions P, and the blue light emitting regions P, the electron transport/injection layer 13c and the second electrode 14 are formed as in the first embodiment, and then sealing is performed. In this way, as shown in FIG. 12D, the micro-cavity structure type organic EL display device 10 of the second embodiment can be manufactured.

In the manufacturing method of an organic EL display device of this embodiment, it is easy to form portions of the hole injection/transport layer 13a having different thicknesses in the light emitting regions P of different colors independently. Thus, the micro-cavity effect can be optimized for the light emitting regions P of each color.

Third Embodiment

Figure 13:
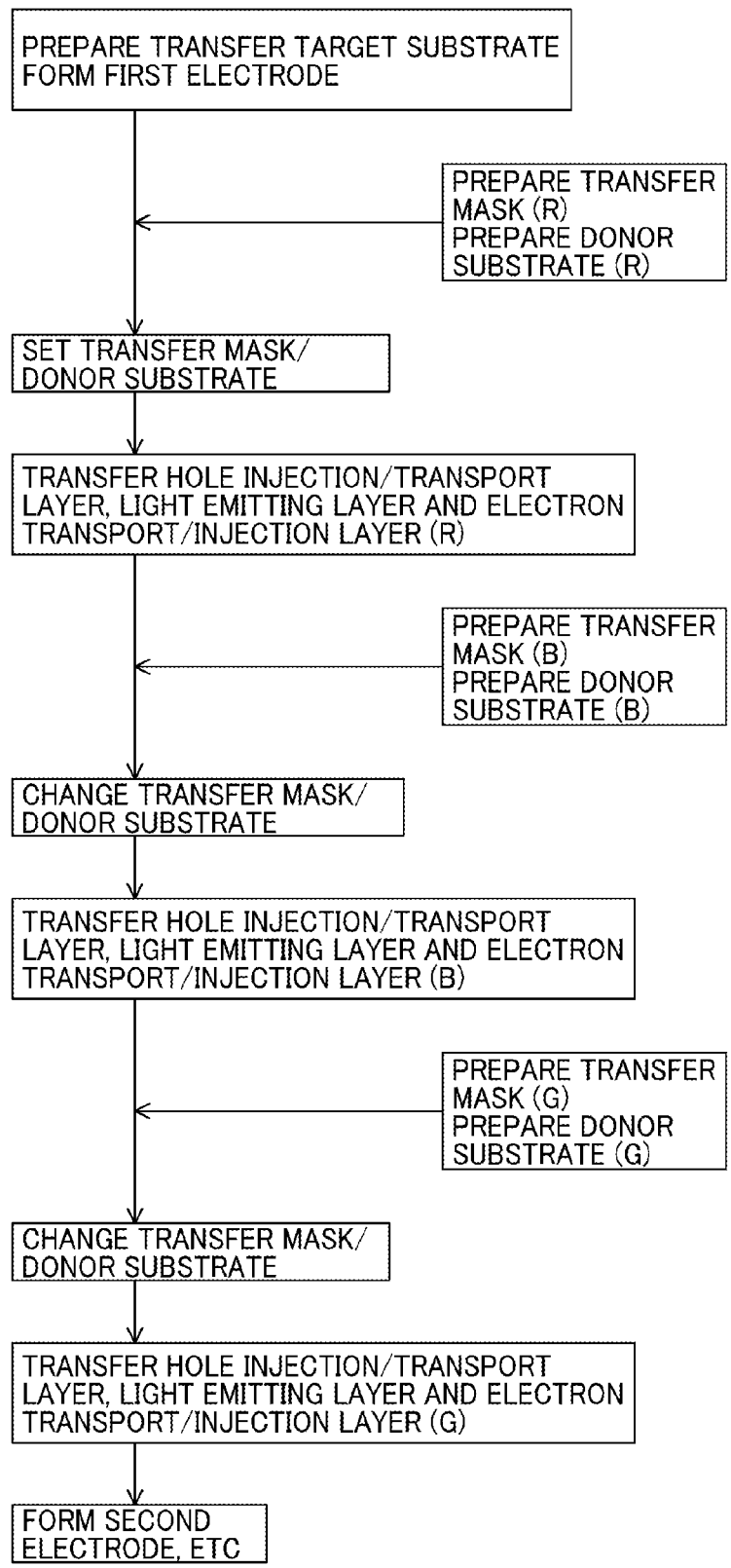
FIG. 13 shows a manufacturing process of an organic EL display device of the third embodiment.

FIG. 13 shows a manufacturing process of an organic EL display device 10 of the third embodiment.

The organic EL display device 10 of this embodiment has an inverted structure where a first electrode 12 is used as a cathode and a second electrode 14 as an anode. On the first electrode 12, formed is an organic EL layer 13 that includes an electron injection/transport layer 13c, an emitting layer 13b, and a hole transport/injection layer 13a formed sequentially, and then the second electrode 14 is formed on the organic EL layer 13. The first electrode 12 is made of an Al film having a thickness of 100 nm, for example, and the second electrode 14 is made of an IZO film having a thickness of 100 nm, for example.

<Transfer Target Substrate Preparation Process>

First, the first electrode 12, an edge cover 16, and mask spacers 17 are formed on a substrate body 11 in a manner similar to that in the first embodiment, to obtain a transfer target substrate 20.

<Donor Substrate/Transfer Mask Preparation Process>

(Donor Substrate)

Unlike the first embodiment, a donor substrate 30 has three kinds of transfer materials formed on top of another on a support plate 31. Specifically, a transfer material that is to be the hole transport/injection layer 13a, a transfer material that is to be the emitting layer 13b, and a transfer material that is to be the electron injection/transport layer 13c are formed sequentially from the side closer to the support plate 31, constituting a transfer layer 34.

When a plurality of kinds of transfer materials are formed on top of the other to constitute the transfer layer of the donor substrate 30, it is preferable that one, out of the plurality of kinds of transfer materials, lower in vaporizing temperature is formed to be closer to the support plate 31 while one higher in vaporizing temperature is formed to be farther from the support plate 31. With this placement, even if the temperature of the transfer material located closer to the support plate 31 reaches its vaporizing temperature that is low, transfer will not be performed as far as the temperature of the transfer material located farther from the support substrate 31 has not reached its vaporizing temperature that is high. Once the temperature of the transfer material located farther from the support substrate 31 has reached its vaporizing temperature, both transfer materials are transferred simultaneously. It is therefore possible to perform transfer while maintaining the layered state of the transfer materials.

(Transfer Mask)

The same transfer mask 40 as that in the first embodiment is prepared.

<Transfer Process>

Next, as shown in FIGS. 14A-14C, a donor substrate 30, a transfer mask 40, and the transfer target substrate 20 are superposed on one another, and subjected to the transfer process. The details of the transfer process are similar to those in the first embodiment.

<Second Electrode, Etc Formation Process>

Subsequently, the second electrode 14 is formed in the same manner as in the first embodiment, and then sealing is performed. In this way, as shown in FIG. 14D, the micro-cavity structure type organic EL display device 10 of the third embodiment can be manufactured.

In the manufacturing method of an organic EL display device of this embodiment, since the transfer layer 34 having the three-layer structure made of the transfer material that is to be the hole transport/injection layer 13a, the transfer material that is to be the emitting layer 13b, and the transfer material that is to be the electron injection/transport layer 13c is formed on the support plate 31 of the donor substrate 30, the electron injection/transport layer 13c, the emitting layer 13b, and the hole transport/injection layer 13a can be formed by one time of transfer process. Thus, the time required for formation of the organic EL layer 13 can be shortened.

Although three kinds of transfer materials are formed on top of another on the support plate 31 of the donor substrate 30 in the third embodiment, two kinds of transfer materials may be formed on top of the other to form the transfer layer 34. For example, the material of the electron injection/transport layer 13c as the first transfer layer 34 and the material of the emitting layer 13b as the second transfer layer 34 may be formed on the support plate 31 in the order of the second transfer layer 34 and the first transfer layer 34, and transferred simultaneously, to form the first organic layer (electron injection/transport layer 13c) and the second organic layer (emitting layer 13b) on the transfer target substrate 20 in this order by transfer, thereby forming the organic EL display device 10 having the inverted structure. Otherwise, using the transfer target substrate 20 with layers up to the electron injection/transport layer 13c formed thereon, the material of the emitting layer 13b as the first transfer layer 34 and the material of the hole injection/transport layer 13a as the second transfer layer 34 may be formed on the support plate 31 in the order of the second transfer layer 34 and the first transfer layer 34, and transferred simultaneously, to form the first organic layer (emitting layer 13b) and the second organic layer (hole injection/transport layer 13a) on the transfer target substrate 20 in this order by transfer, thereby forming the organic EL display device 10 having the inverted structure.

Fourth Embodiment

An organic EL display device 10 of the fourth embodiment will be described. The organic EL display device 10 of this embodiment is of a top emission type as that of the first embodiment, and can be manufactured in the same process as that in the first embodiment except for the configuration of the donor substrate 30.

<Transfer Target Substrate Preparation Process>

First, a first electrode 12, an edge cover 16, mask spacers 17, and a hole injection/transport layer 13a are formed on a substrate body 11 in a manner similar to that in the first embodiment, to obtain a transfer target substrate 20.

<Donor Substrate/Transfer Mask Preparation Process>

(Donor Substrate)

Figure 15:
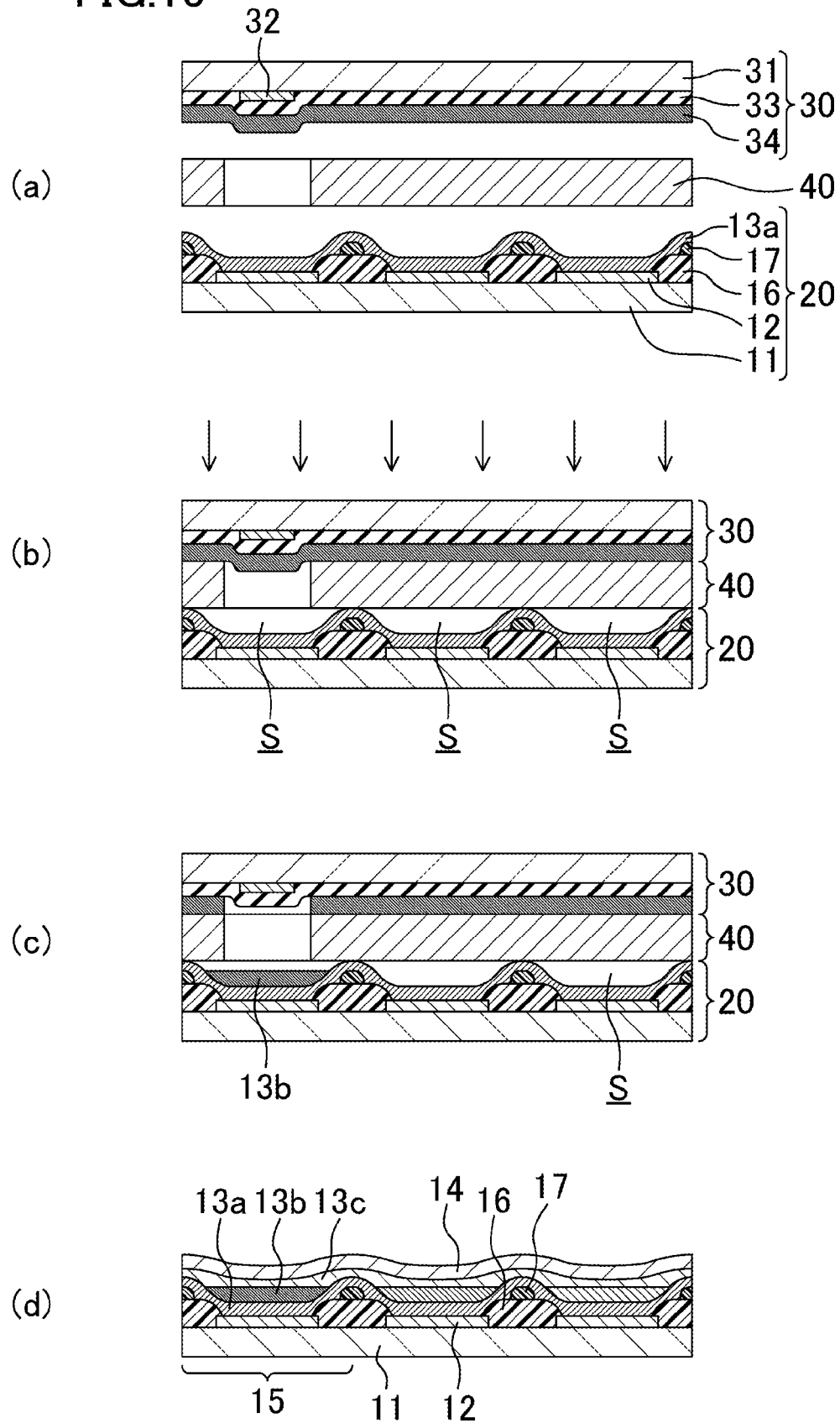
FIGS. 15A-15D are views illustrating a manufacturing method of an organic EL display device of the fourth embodiment

Next, a donor substrate 30 is prepared. First, a light heat converting layer 32 is formed on the entire surface of a support plate 31 by sputtering deposition, electron beam evaporation, resistance heating evaporation, etc., and then coated with a protection film 33 by CVD, sputtering, etc. At this time, as shown in FIG. 15A, the light heat converting layer 32 is patterned to correspond to organic layer formation regions. The composing materials, etc. are similar to those in the first embodiment. A transfer layer 34 is then formed on the support plate 31.

(Transfer Mask)

A transfer mask 40 similar to that in the first embodiment is used. Note that, since the light heat converting layer 32 is not formed in regions other than the organic layer formation regions, the transfer mask 40 is to be irradiated with light. Therefore, it is preferable that the surface of the transfer mask 40 facing the donor substrate 30 is formed of a material high in optical reflectance.

<Transfer Process>

Next, as shown in FIGS. 15A-15C, the donor substrate 30, the transfer mask 40, and the transfer target substrate 20 are superposed on one another, and subjected to the transfer process. The details of the transfer process are similar to those in the first embodiment.

<Second Electrode, Etc Formation Process>

Subsequently, an electron transport/injection layer 13c and a second electrode 14 are formed in a manner similar to that in the first embodiment, and then sealing is performed. In this way, as shown in FIG. 15D, the organic EL display device 10 of the fourth embodiment can be manufactured.

In the manufacturing method of the organic EL display device 10 of this embodiment, in the transfer process, since the light heat converting layer 32 of the donor substrate 30 is patterned to correspond to the organic layer formation regions, light incident on regions other than the organic layer formation regions is not converted to heat, and thus useless conduction of heat to the transfer target substrate 20 can be prevented or reduced. Therefore, the problem that the transfer target substrate 20 may be damaged by heat can be prevented or reduced.

Also, since the light heat converting layer 32 is patterned, the donor substrate 30 can be easily aligned with the transfer target substrate 20 and the transfer mask 40 using alignment markers patterned on the donor substrate 30.

Fifth Embodiment

An organic EL display device 10 of the fifth embodiment will be described. The organic EL display device 10 of this embodiment can be manufactured in the same process as that in the fourth embodiment except for the configuration of the transfer mask 40.

<Transfer Target Substrate Preparation Process>

First, a first electrode 12, an edge cover 16, mask spacers 17, and a hole injection/transport layer 13a are formed on a substrate body 11 in a manner similar to that in the fourth embodiment, to obtain a transfer target substrate 20.

<Donor Substrate/Transfer Mask Preparation Process>

(Donor Substrate)

A donor substrate 30 having the same configuration as that in the fourth embodiment is prepared.

(Transfer Mask)

Figure 16:
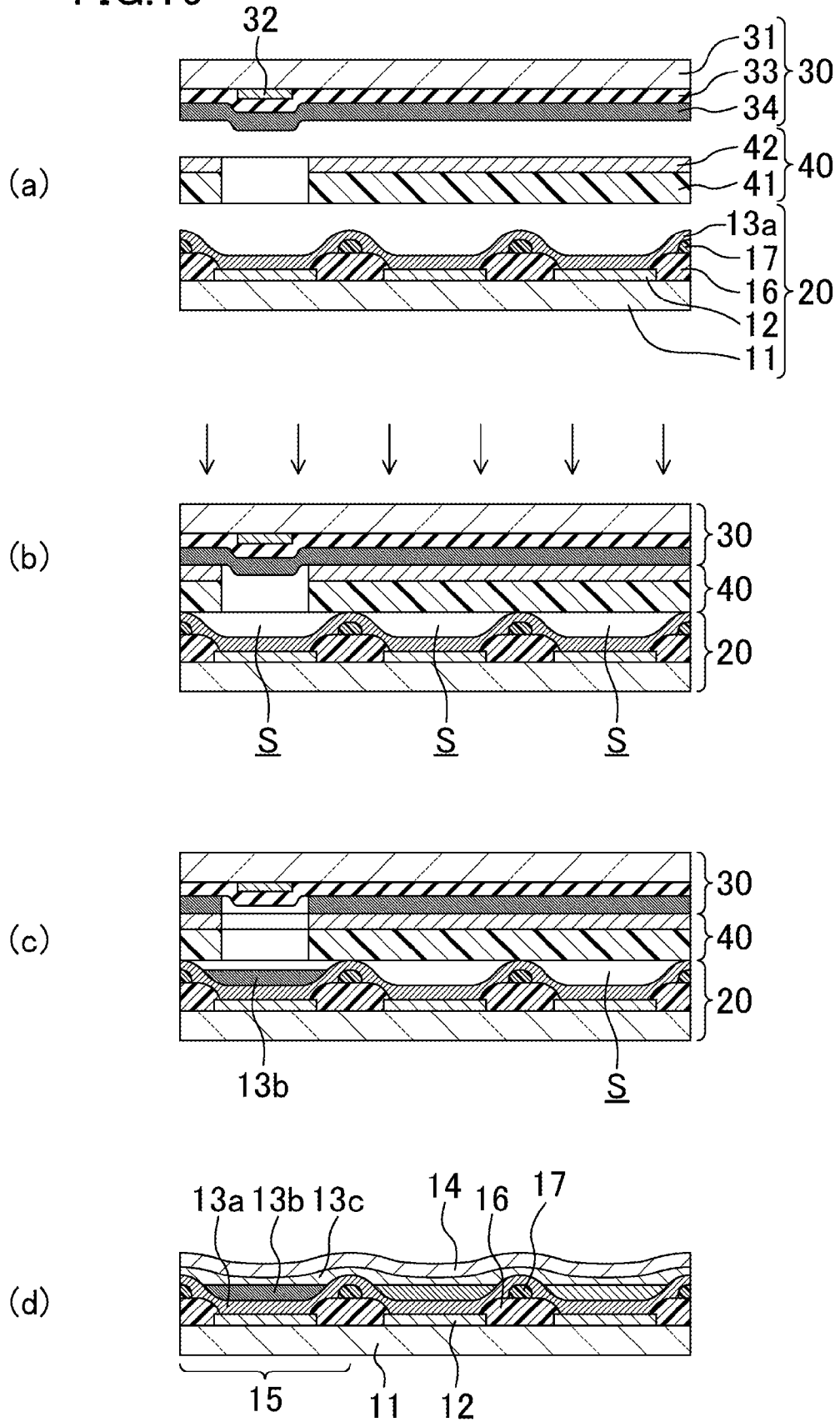
FIGS. 16A-16D are views illustrating a manufacturing method of an organic EL display device of the fifth embodiment

In this embodiment, as shown in FIG. 16A, a light reflection layer 42 is placed on the surface of a mask body 41 facing the donor substrate 30, to form a transfer mask 40.

As the material of the mask body 41, an inexpensive material such as polyimide, for example, may be used. The mask body 41 has a thickness of 100 µm, for example.

As the material of the light reflection layer 42, a metal film such as aluminum, for example, may be used. The light reflection layer 42 has a thickness of 100 nm, for example, and is formed on the surface of the mask body 41 by sputtering.

With the presence of the light reflection layer 42 on the surface of the transfer mask 40, the optical reflectivity of the mask surface enhances, and also the manufacturing cost of the transfer mask 40 can be reduced by forming the mask body 41 using an inexpensive material.

<Transfer Process>

Next, as shown in FIGS. 16A-16C, the donor substrate 30, the transfer mask 40, and the transfer target substrate 20 are superposed on one another, and subjected to the transfer process. The details of the transfer process are similar to those in the fourth embodiment.

<Second Electrode, Etc Formation Process>

Subsequently, as in the fourth embodiment, an electron transport/injection layer 13c and a second electrode 14 are formed, and finally sealing is performed, whereby, as shown in FIG. 16D, the organic EL display device 10 of the fifth embodiment can be manufactured.

In the manufacturing method of the organic EL display device 10 of this embodiment, with the presence of the light reflection layer 42 on the side of the transfer mask 40 facing the donor substrate 30, light incident on the transfer mask 40 is reflected toward the donor substrate 30, preventing or reducing leakage of light to the transfer target substrate 20.

Other Embodiments

The donor substrate 30 having the patterned light heat converting layer 32 as in the fourth and fifth embodiments may also be applied to the case of manufacturing the microcavity structure type organic EL display device 10 as in the second embodiment, and the case of forming the transfer layer 34 of a layered structure where three kinds of transfer materials are placed on top of another as in the third embodiment.

In the first to fifth embodiments described above, the organic EL layer 13 is formed by transfer into a pattern on the transfer target substrate 20 that is a substrate having the first electrode 12 formed thereon, to manufacture the organic EL display device 10. The present disclosure is not limited to this, but is applicable to other cases of forming an organic layer into a pattern on the transfer target substrate 20.

INDUSTRIAL APPLICABILITY

The present disclosure is useful in a formation method of an organic layer, a manufacturing method of an organic EL element, an organic EL element, and an organic EL display device.

DESCRIPTION OF REFERENCE CHARACTERS

P Light Emitting Region
S Space
10 Organic EL Display device
11 Substrate Body
12 First Electrode
13 Organic EL layer
14 Second Electrode
15 Organic EL Element
16 Edge Cover
17 Mask Spacer
18 Peripheral Spacer
18a Auxiliary Spacer
20 Transfer Target Substrate
30 Donor Substrate
31 Support Plate
32 Light Heat Converting Layer
34 Transfer Layer
40 Transfer Mask
41 Mask Body
42 Light Reflection Layer

The invention claimed is:

1. A formation method of an organic layer, comprising:
a transfer process of forming an organic layer by superposing a donor substrate having a light heat converting layer and a transfer layer formed sequentially to cover at least regions corresponding to organic layer formation regions on a support plate, a transfer mask having openings corresponding to the organic layer formation regions, and a transfer target substrate on a surface of which an organic layer is to be formed, on one another so that one surface of the transfer mask comes into contact with a transfer layer-side surface of the donor substrate and the other surface of the transfer mask comes into contact with the organic layer formation-side surface of the transfer target substrate, and, in this state, transferring the transfer layer onto the transfer target substrate via the openings of the transfer mask, wherein
a surface of the transfer mask facing the transfer layer of the donor substrate is higher in optical reflectance than a transfer mask-side surface of the light heat converting layer.

2. The formation method of an organic layer of claim 1, wherein
the transfer mask has a light reflection layer formed to cover a surface of a mask body facing the transfer layer of the donor substrate.

3. The formation method of an organic layer of claim 2, wherein
the transfer mask has the light reflection layer made of aluminum formed on the mask body made of polyimide.

* * * * *